United States Patent
Itoh et al.

(10) Patent No.: US 6,876,569 B2
(45) Date of Patent: *Apr. 5, 2005

(54) SEMICONDUCTOR INTEGRATED CIRCUIT DEVICE WITH IMPROVED STORAGE MOSFET ARRANGEMENT

(75) Inventors: Kiyoo Itoh, Higashikurume (JP); Kazuo Nakazato, Cambridge (GB)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/796,023

(22) Filed: Mar. 10, 2004

(65) Prior Publication Data
US 2004/0170050 A1 Sep. 2, 2004

Related U.S. Application Data

(63) Continuation of application No. 10/330,077, filed on Dec. 30, 2002, now Pat. No. 6,762,951, which is a continuation of application No. 09/959,906, filed as application No. PCT/JP99/02519 on May 14, 1999, now Pat. No. 6,515,892.

(51) Int. Cl.[7] ............................................. G11C 11/24
(52) U.S. Cl. .................................. 365/149; 365/189.01
(58) Field of Search ........................... 365/149, 189.01, 365/189.09, 189.11, 203, 207, 63

(56) References Cited

U.S. PATENT DOCUMENTS

| 4,771,323 A | 9/1988 | Sasaki |
| 4,920,391 A | 4/1990 | Uchida |
| 5,220,530 A * | 6/1993 | Itoh ....................... 365/189.01 |
| 5,675,160 A | 10/1997 | Oikawa |
| 5,995,410 A * | 11/1999 | Forbes ........................ 365/149 |
| 6,314,017 B1 | 11/2001 | Emori et al. |
| 6,388,934 B1 | 5/2002 | Tobita |
| 6,452,858 B1 | 9/2002 | Hanzawa et al. |
| 6,515,892 B1 | 2/2003 | Itoh et al. |
| 6,519,195 B2 | 2/2003 | Kanno et al. |

FOREIGN PATENT DOCUMENTS

| JP | 58-220464 A | 12/1983 |
| JP | 1-255269 A | 10/1989 |
| JP | 2-54572 A | 2/1990 |
| JP | 63-19847 A | 11/1994 |
| JP | 8-250673 A | 9/1996 |

OTHER PUBLICATIONS

Ultra LSI Memories, Baifukan, Nov. 5, 1994, Kiyoo Itoh, pp. 12–15.
ISSCC '72, VLSI Memory Chip Design, Kiyoo Itoh, pp. 12–13.

* cited by examiner

Primary Examiner—Gene N. Auduong
(74) Attorney, Agent, or Firm—Antonelli, Terry, Stout & Kraus, LLP

(57) ABSTRACT

A semiconductor integrated circuit device including a plurality of memory cells, each having a storage MOSFET holding information in a gate of the storage MOSFET, a write transistor supplying a write information voltage corresponding to the information to the gate storage MOSFET, and a capacitor having first and second terminals. Word lines and data lines are coupled with the memory cells. The first capacitor terminal is coupled with one of the word lines and the second capacitor terminal is coupled with the gate of the storage MOSFET. In a read operation of the semiconductor integrated circuit device, the gate voltage of the storage MOSFET is boosted by a transition of the word line from a first voltage to a second voltage greater than the first voltage.

19 Claims, 12 Drawing Sheets

SEMICONDUCTOR INTEGRATED CIRCUIT DEVICE WITH IMPROVED STORAGE MOSFET ARRANGEMENT

CROSS-REFERENCE TO RELATED APPLICATIONS

This is a Continuation of application Ser. No. 10/330,077, filed Dec. 30, 2002 now Pat. No. 6,762,951, which is a Continuation of application Ser. No. 09/959,906, filed Nov. 13, 2001 (now U.S. Pat. No. 6,515,892), which is a National Stage Application filed under 35 U.S.C. § 371 of International (PCT) Application No. PCT/JP99/02519, filed May 14, 1999, the entire disclosure of which is hereby incorporated by reference.

FIELD OF THE INVENTION

This invention relates to a semiconductor integrated circuit device and relates in particular to a high reliability, large capacity semiconductor memory circuit.

BACKGROUND OF THE INVENTION

Semiconductor memories are broadly classified into RAM (random access memories) and ROM (read only memory) devices. Among these devices, the dynamic RAM (DRAM) is used in the largest numbers as the main memory for computers. The memory cells that store the information are composed of one capacitor and a transistor to read out the charge stored on that capacitor. This memory cell can form the smallest structural element on the RAM and is therefore ideal for use on a large scale. Accordingly, this large scale use results in making these memory cell devices ideal for mass production at a low price.

However, the DRAM has a problem in that operation tends to be unstable. The largest cause of this instability is that the memory cell itself has no amplifying effect and therefore the read out signal voltage from the memory cell is small and the memory cell operation is susceptible to all kinds of random noise. Another drawback is that the information charge stored in the capacitor is lost due to the leakage current in the pn junction within the memory cell. Before this charge is lost, a refresh (rewrite) operation is performed periodically on the memory cell to retain the memory information stored in the memory cell. The period is referred to as the refresh period and currently requires approximately 100 milliseconds, however this refresh period becomes longer as the memory capacity increases. In other words, the leakage current must be limited but restricting the leakage current becomes more and more difficult as the elements become smaller.

A memory to solve these problems was the ROM and the flash memory in particular. As is well known, the flash memory is at least as small as a DRAM cell and the memory cell has internal gain so that the signal voltage is essentially large, and operation is therefore stable. A storage charge is also accumulated in the storage node enclosed by an insulator film so that like the DRAM, there is no current leakage from the pn junction and a refresh operation is not required. However, a weak tunnel current flows to accumulate the charge in the storage mode so that the write time is extremely long. Also, repeating the write operation causes electrical current to flow in the insulator film and the insulator film gradually deteriorate and finally the insulator film becomes a conductive film that is unable to retain information.

The ROM device is therefore generally limited to about 100,000 write operations. In other words, the flash memory cannot be utilized as a RAM. The DRAM and flash memory therefore both have a large capacity memory and respective advantages and disadvantages. The particular advantages of each device have to be considered when using the device.

A method of the known art for a three transistor cell comprised of a storage MOSFET to store an information voltage in a gate, and a write MOSFET to write an information voltage in a gate was disclosed for instance in "Ultra LSI Memories" Baifukan, Nov. 5, 1994 Kiyoo Itoh, PP. 12–15. The three-transistor cell of this type had an amplification function in the cell itself so that the signal voltage appearing in the data line was large, and read out was totally non-destructive however this device also had problems since the peripheral circuits for read and write operations were complicated and difficult to use so that the three transistor cell was not practical to use.

In view of the above problems with the prior art, it is an object of the present invention to provide a semiconductor integrated circuit device having a memory circuit with simple circuit structure that is also easy to use.

Yet another object of the present invention is to provide a semiconductor integrated circuit device having a memory circuit that is both high speed and nonvolatile. The above mentioned and other new features and objects of this invention will be apparent to one skilled in the art from the description of this invention and the accompanying reference drawings.

SUMMARY OF THE INVENTION

A simple description of the concept of the invention as disclosed in this application is as follows. A semiconductor device has a memory cell array comprised of memory cells containing a write transistor and a storage MOSFET for holding an information voltage in the gate, a word line intersecting with a write data line for conveying write information voltages and an intersecting read line for conveying read information signals corresponding to the on or off state of the storage MOSFET memory cell, the control terminals of the write transistors of the memory cell are connected by the word lines and the read signal is output on the corresponding read data line in response to the select signal from the write transistor control terminals, and one read data line is selected from among a plurality of read data lines by the data line select circuit and is connected to either a first or second common data line, the selected read data line is precharged to a first voltage potential in the non-select period, in a first select period that word line is selected for read out and discharged to a second voltage potential by the on status of the storage MOSFET of the memory cell, the first and second common data lines are precharged to a third voltage potential between the first and second voltage potentials in the non-select period, the read signal appearing in the first select period on the read data line selected by the data line select circuit and in one common data line corresponding to the dispersed charge are amplified using the precharge voltage of another common data line as the reference voltage, after the write signal is conveyed on the write data line, when necessary, in the second select period the word lines are set to a high voltage and the write transistor is set to on status to perform write or rewrite in the memory cell.

A simple description of another representative concept of the invention as disclosed in this application is as follows. Namely, a semiconductor device has a memory cell array comprised of memory cells containing a write transistor and a storage MOSFET for holding an information voltage in the gate, a word line intersecting with a write data line conveying write information signals and an intersecting read data line conveying read information signals corresponding to the on or off state of the storage MOSFET of the memory cell, the control terminals of the write transistors of the memory cell are connected by the word lines, and the read signal is output on the corresponding read data line in response to the select signal from the control terminals, a sense amplifier comprised of a CMOS latch structure is formed between the write data line and the read data line, that read data line is precharged to a first voltage potential in a first period, that write data line is precharged to a second voltage smaller than the first voltage in the first period, the word line is selected in a second period and the read data line is discharged to a third voltage potential by the on status of the storage MOSFET of the memory cell, the sense amplifier is set to operating status after the read data line has been set to the first voltage or the third voltage corresponding to the memory cell information voltage and the high level or low level state is amplified according to the operating voltage of the sense amplifier, and a data line select circuit selects one pair of data lines from among a plurality of pairs comprised of read data lines and their corresponding write data lines and connect that data line pairs to a first and second common data line.

DETAILED DESCRIPTION OF THE PREFERRED EMBODIMENTS

Hereafter, a detailed description of this invention will be given while referring to the related drawings.

Figure 1:
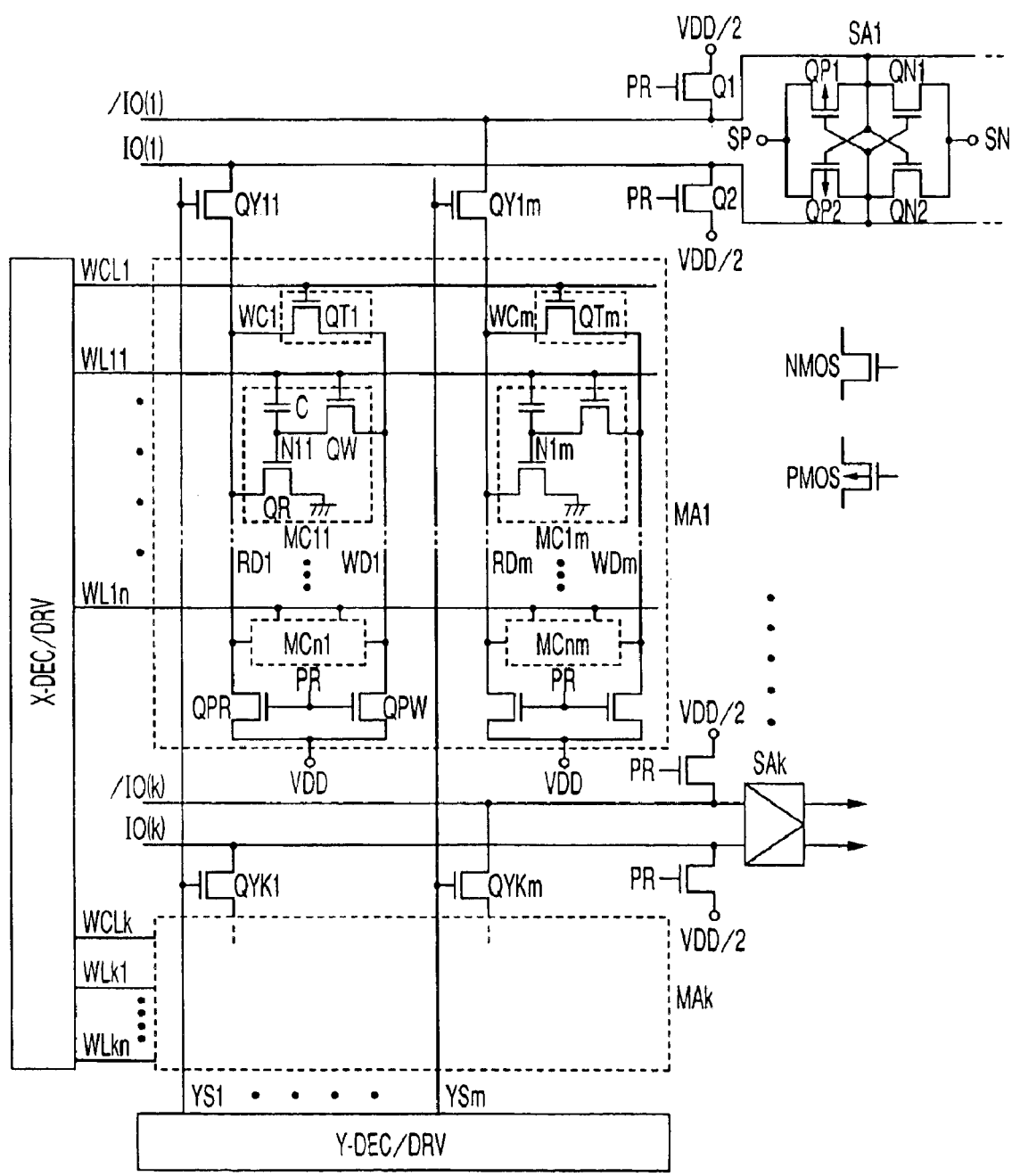
FIG. 1 is an essential portion of a circuit schematic showing an embodiment of the memory circuit comprising the semiconductor integrated circuit of this invention.

FIG. 1 is a circuit schematic showing an example of the memory circuit comprising the semiconductor integrated circuit of this invention. Each of the element and circuit blocks are formed by semiconductor integrated circuit manufacturing technology of the known art on a semiconductor (LSI) substrate made of single crystalline silicon.

In this embodiment, the data lines are separated into a read data lines RD and write data lines WD with no particular restrictions, however these lines extend in parallel in a perpendicular direction. In FIG. 1, the read data lines RD and write data lines WD are provided in pairs from 1 to n number of pairs and of these data line pairs, two pairs consisting of data line pair RD1, WD1–RDm and WDm are used as examples.

In one memory array MA1, one or n pairs of word lines WL11–WL1n extend in the horizontal direction so as to cross the plurality of data line pairs RD1, WD1–RDm and WDm. Of these plurality of word lines 1 through n, two pairs of word lines WL11 and WL1n are used as examples. These word lines are not subject to any particular restrictions but a plurality of memory arrays MA1–MAk from 1 through k are formed in the direction of the data lines and in each memory array MA, a plurality of word lines 1 through n, are formed the same as each memory array MA1.

The structure of the memory array is next explained using the memory array MA1 as an example. A memory cell MC11 formed at the cross point of the word line WL11 and the data lines RD1, WD1, is comprised of a storage MOSFET QR to retain an information voltage at its gate and set to on or off status when the word line WL11 is selected according to this information voltage, a write MOSFET QW at the gate of the MOSFET QR for conveying the write signal of the write data line WD, and a capacitor C formed between the gate of the MOSFET QR and the word line WL11 to set the MOSFET QR to off status regardless of the memory voltage when the word line is not selected.

The gate of the write MOSFET QW is connected to the word line WL11. The source/drain path of the storage MOSFET QR is connected to the read data line RD1 and the ground voltage VSS (o volts) of the circuit.

A precharge MOSFET QPR and QPW with switching being controlled by the precharge signal PR, are formed on the read data line RD1 and the write data line WD1, and the data lines RD1 and WD1 are precharged to voltage VDD in the precharge period.

A write control circuit WC1 is formed between the read data line RD1 and the write data line WD1 to convey the read data line RD1 signal to the write data line WD1. There are no particular restrictions in this embodiment and the write control circuit WC1 is comprised of a MOSFET QT1 whose switching is controlled by a control line WCL1 extending in parallel with the word line WL.

The data lines RD2, WD2 formed the same as the adjoining pair of data lines RD1 and WD1, also have an identical memory cell, precharge circuit and write control circuit.

The read data lines RD1 through RDm are connected to either of a pair of complementary common data lines /IO(1)

and IO(1) by way of switch MOSFET QY11 through QY1m comprising the data line select circuits. There are no particular restrictions but the read data lines RD1 through RDm formed in the memory array MA1 are configured of even-numbered lines, and for instance the odd-numbered read data lines RD1, RD3, . . . are connected to the common data lines IO (1) and the even-numbered read data lines RD2, RD4, . . . RDm are connected to the common data lines /IO(1).

The number of read data lines connected to the pair of the complementary common data lines IO(1) and /IO(1) are therefore equal and the number of switch MOSFETs comprising the data line select circuit corresponding to the common data lines IO(1) and /IO(1) are also equal. The common data lines IO(1) and /IO(1) have an equivalent length and are also connected to the same number of switch MOSFETs and so have largely the same parasitic capacitance.

Here, the complementary common data lines are comprised of an inverted common data line /IO in which a low level corresponds to a logic 1, and a non-inverted complementary common data line IO (1) in which a high level corresponds to a logic level 1, the slash / indicates the overbar of the logic symbol.

A MOSFET Q1 and MOSFET Q2 are formed in the complementary common data lines IO(1) and /IO(1) to precharge to a half-precharge voltage VDD/2 corresponding to one-half of the discharge voltage (0 volts) and precharge voltage (VDD) of the read data line. The gates of the MOSFET Q1 and Q2 are supplied by the precharge signal PR. Identical common data lines and precharge circuits are also formed in the other memory arrays MA2 through MAk.

The plurality of word lines WL11 through WL1n, and WLKk1 through WLKn formed in the memory arrays MA1–MAk are selected one line apiece by the X decoder & drivers X-DEC/DRV for the memory arrays MA1–MAk.

The select signals YS1 through YSm formed by means of the Y decoder & driver Y-DEC/DRV simultaneously select the read data lines RD1–RDk that correspond to the memory arrays MA1–MAk, and connect the read data lines RD1–RDk to any or any one of the corresponding common data lines IO(1), /IO(1) through IO(k), /IO(k). Consequently, memory access is performed in k bit units consisting of 1 through k in this embodiment of the memory circuit. A simplified circuit can therefore be achieved by utilizing the Y decoder & driver Y-DEC/DRV such as mentioned above, in common with the data line selection operation for the memory arrays MA1 through MAk.

There are no particular restrictions on the common data lines IO (1) and /IO(1) and a CMOS latch circuit formed as the sense amplifier SA1 consists of an N-channel MOSFET QN1 and QN2 as well as P-channel MOSFET QP1 and QP2 that form CMOS inverter circuits with intersecting input and output connections. The sense amplifier SA1 consisting of these CMOS latch circuits is configured so that the respective common sources SN and SP for the N-channel MOSFET QN1, QN2 and the P-channel MOSFET QP1 and QP2 are enabled by application of operating voltages such as supply voltage VDD and ground voltages of the circuit.

An identical sense amplifiers SAk are also formed for the other common data lines IO (k) and /IO(k) shown as examples. The sources SN and SP for the amplifying MOSFETS of these sense amplifiers SA1–SAk are supplied in common with the above mentioned operating voltages. The k number of sense amplifiers SA1–SAk from 1 though k start amplifying operation all together, and amplify the read signals read out from the common data lines IO and /IO corresponding to each of the sense amplifiers.

These amplified signals are output from external terminals of the semiconductor integrated circuit device by way of output circuits not shown in the drawing. Write signals may also be supplied from the external terminals and supplied by way of the input circuits with no particular restrictions. The write signals are amplified by the above mentioned sense amplifiers SA1–SAk, conveyed to the respective write data lines by way of selected read data line and the write control circuits WC and written into the memory cell.

Figure 2:
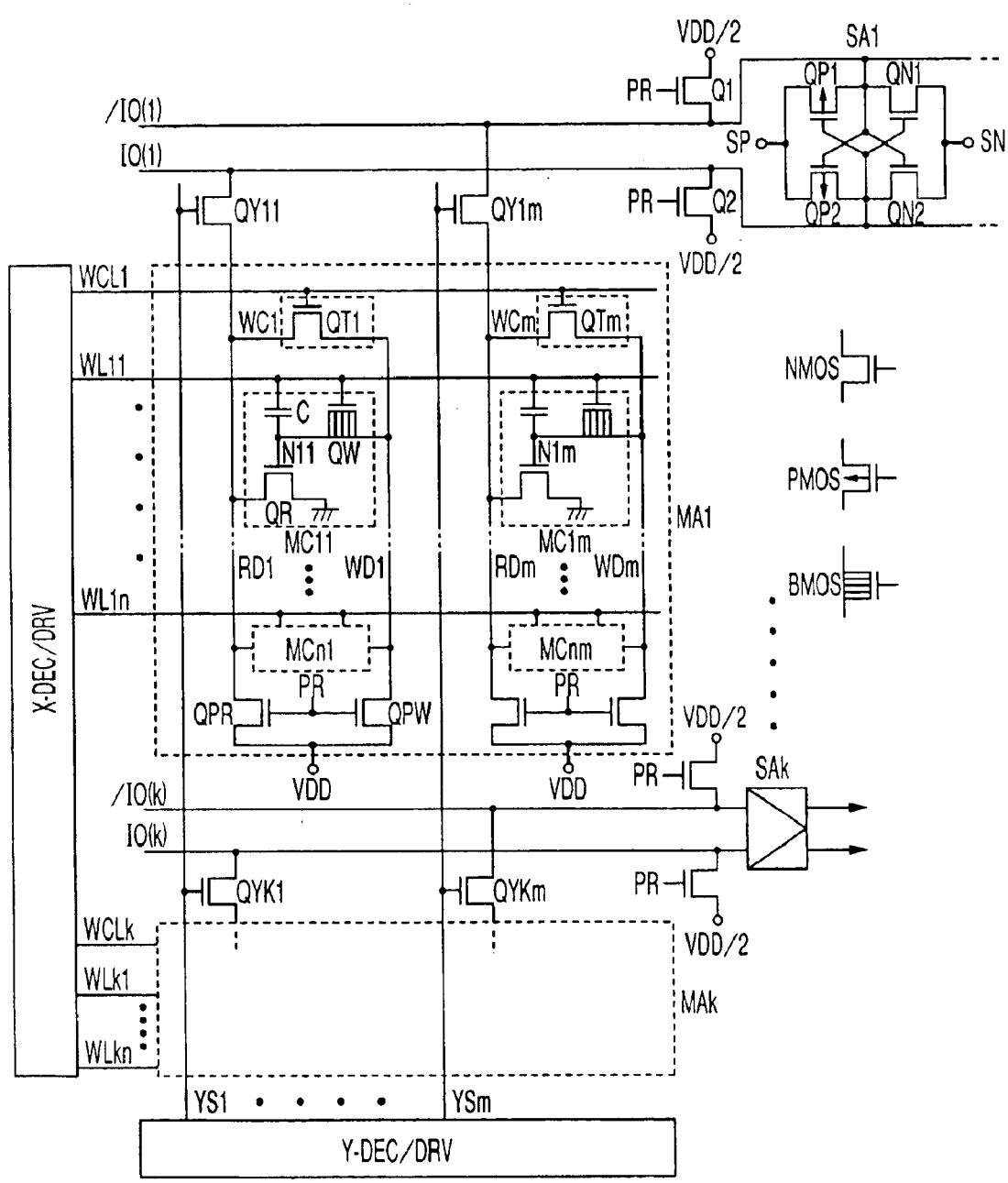
FIG. 2 is an essential portion of a circuit schematic showing another embodiment of the memory circuit comprising the semiconductor integrated circuit of this invention.

FIG. 2 is a circuit schematic showing another embodiment of the memory circuit comprising the semiconductor integrated circuit of this invention. The memory charge in this embodiment is intended to be nonvolatile with respect to the memory charge. The transistor for writing nonvolatile memory charges utilizes a MOSFET with a barrier insulator structure (hereafter simply BMOS) instead of the MOSFET used in the previous embodiment.

In this embodiment, the N-channel MOSFET (NMOS) for the write transistor QW is instead substituted with a MOSFET (BMOS) however in all other respects the structure of the embodiment is the same as the first embodiment, accordingly a description of those portions is omitted here.

Figure 3:
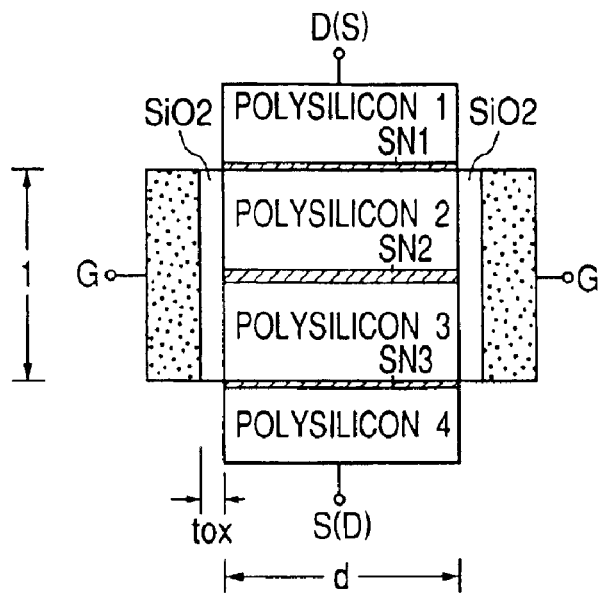
FIG. 3 is a concept view of the cross sectional structure for an embodiment of the BMOS transistor utilized in the circuit of FIG. 2.

FIG. 3 is a concept view of the cross sectional structure of the BMOS transistor of the embodiment. An important feature is that gate electrodes G are formed in a vertical structure by means of gate oxide layers (heat oxidized film thickness of tox) on both sides of the four layers of laminated polysilicon (poly 1 to poly 4). The gate electrodes formed on both sides of the polysilicon layers are in fact integrated into one piece with a constant, equivalent electrical potential as subsequently related. The polysilicon 1 and polysilicon 4 are doped with $10^{20} cm^{-3}$ of phosphorus, and form the drain D (or the source S) and source (or drain) of the transistor. The polysilicon 2 and polysilicon 3 are doped with an extremely weak concentration of phosphorus (approximately $10^{-15}$ to $10^{-17}$) forming a transistor substrate of intrinsic polysilicon.

A tunnel layers SN1, SN2, SN3 consisting of for instance thin (2 to 3 nm) silicon nitride layers are formed between the polysilicon 1 and polysilicon 2, the polysilicon 2 and polysilicon 3, as well as the polysilicon 3 and polysilicon 4. The tunnel layers SN1 and SN3 function as stoppers so that the high concentration phosphorus from the drain or source regions does not diffuse into the internal weak concentration layers (polysilicon 2 and polysilicon 3) when forming the transistor.

A tunnel layer that does not have a thick film is required in order to make current flow between the source and drain. The intermediate tunnel layer SN2 restricts the off current of the transistor to a small amount. In other words, the intermediate tunnel layer SN2 functions as a stopper to prevent the positive holes or electrons emitted in the polysilicon 2 and polysilicon 3 regions in the transistor from flowing as electrical current between the source and drain.

Figure 4:
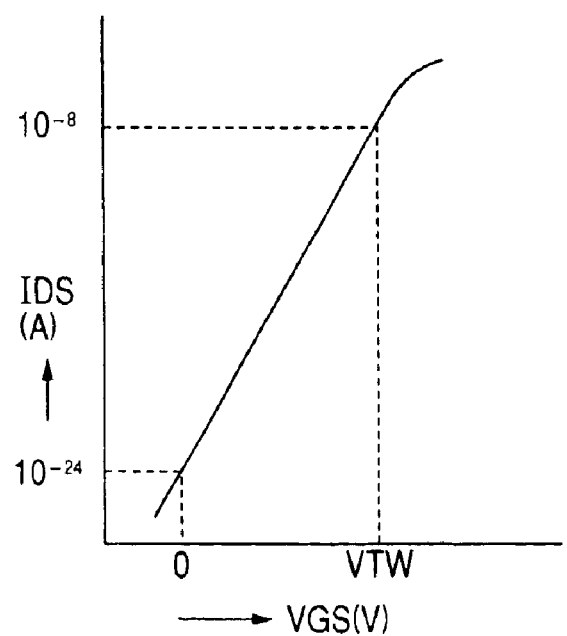
FIG. 4 is a graph of the voltage/current characteristics of the BMOS transistor shown in FIG. 3.

When a sufficiently high positive voltage is applied to the gate, the potential barrier of this tunnel film lowers so that a sufficiently large on current can flow between the source and drain. Of course, this intermediate layer can be reduced according to the target value of off current that is needed. The intermediate layer was assumed to be one layer here, however the tunnel layer can be composed of multiple layer if required. Typical dimensions for the BMOS of FIG. 3 are, l=0.4 μm, d=0.2 μm, and tox=10 nm. When an appropriate thickness is chosen for the tunnel layer in this type of transistor, device voltage and current characteristics approaching those of a horizontal, conventional type MOS transistor with an extremely low substrate concentration can be obtained. A graph of those characteristics is shown in FIG. 4.

The maximum allowable value (I) for electrical current (IDS) flowing between the source and drain is found as follows, in order to assure nonvolatility for a 10 year period. When the allowable memory node (N) capacity (C) is 5 fF, and the allowable memory node voltage drop (delta V) for the 10 year period (delta t) is set to 0.1 volt, then I=C·delta V/delta t=$1.6 \times 10^{-24}$ A is obtained. In normal circuit design, the transistor threshold voltage VWT is defined as a gate/source voltage (VGS) for allowing an electrical current of approximately IDS=$10^{-8}$ A to flow. Since the relation of IDS and VGS is linear in the current region shown by the semi-logarithm in FIG. 4 from $10^{-24}$ A to $10^{-8}$ A, increasing the IDS by one decimal place, to set a VGS value of 100 millivolts, results in a VTW of 0.1 (volts/digit)×16 (digit)= 1.6 volts. This threshold voltage value VTW is the minimum value for maintaining the transistor (QW) in the off state for approximately 10 years. In the actual device design, the threshold value VTW is set to 2 volts, to take variations in the threshold value VTW and its temperature characteristics into account.

Since the maximum value of allowable current for retaining one piece of data of a memory cell for one day is approximately $10^{-20}$ A, then a VTW of 0.1 (volts/digit)×12 (digit)=1.2 volts is sufficient. The standard threshold value VTW may be set to 1.6 volts in order to take manufacturing variations into account. Therefore, compared to nonvolatile operation, the required maximum word voltage (VDD+ VTW or more) decreases by the amount the VTW lowers so that there is less need for a high transistor breakdown voltage for transistors inside the peripheral circuits driving the write transistors (QW) and word lines inside the memory cell.

In such cases the memory cell data is retained if a peripheral refresh (rewrite) operation for the DRAM is performed. In other words, an operation to drive the word lines and periodically perform the aforementioned read out-rewrite in sequence on each word line will prove sufficient.

Figure 5:
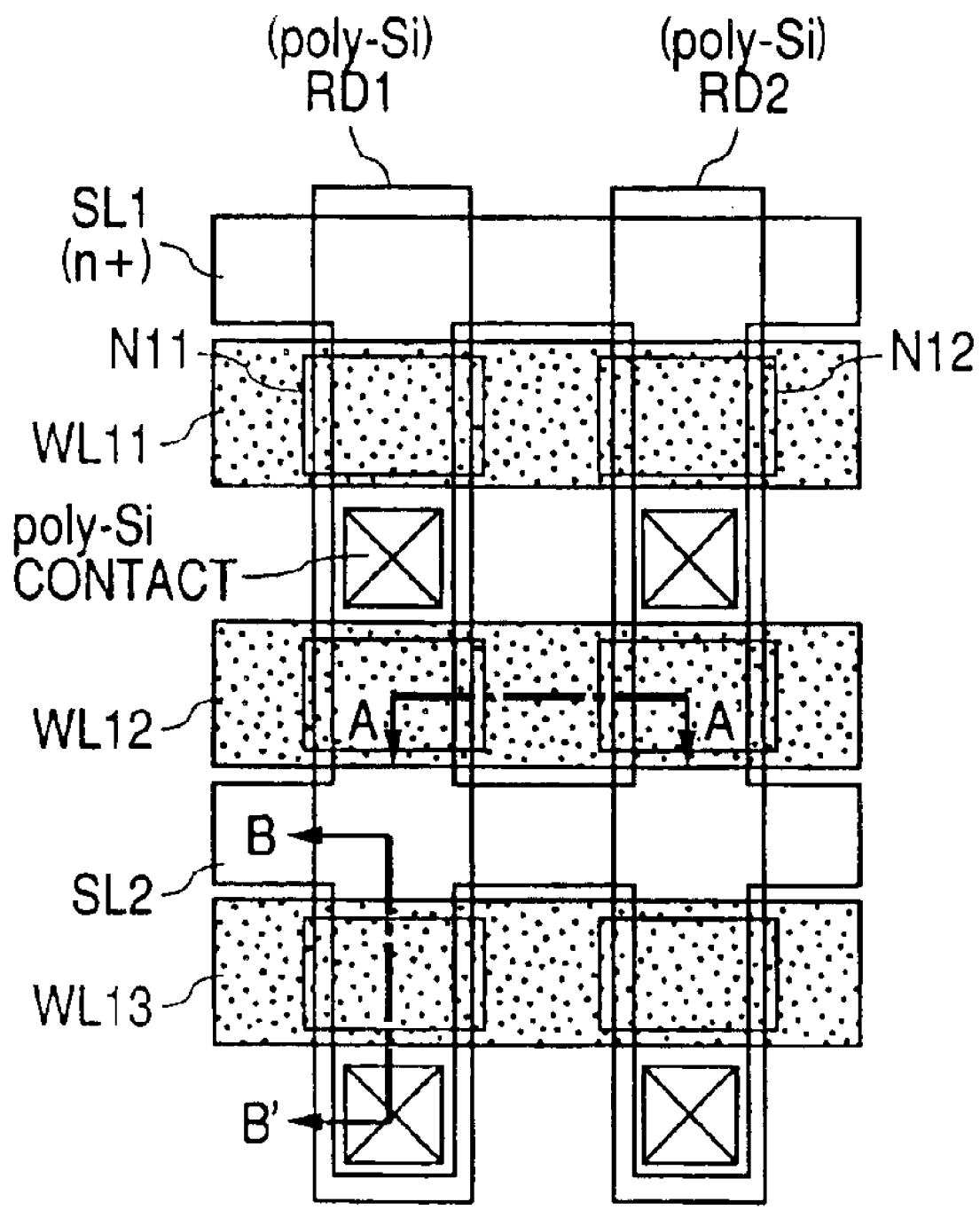
FIG. 5 is a concept plan view of an embodiment of the memory cell for the circuit of FIG. 2.
Figure 6:
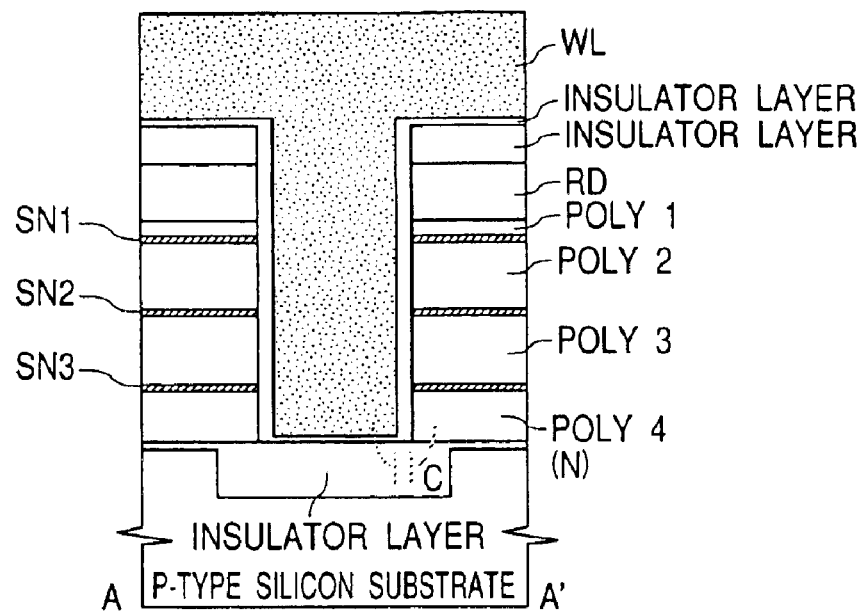
FIG. 6 is a cross sectional view of the memory cell of FIG. 5 taken along lines A–A'.
Figure 7:
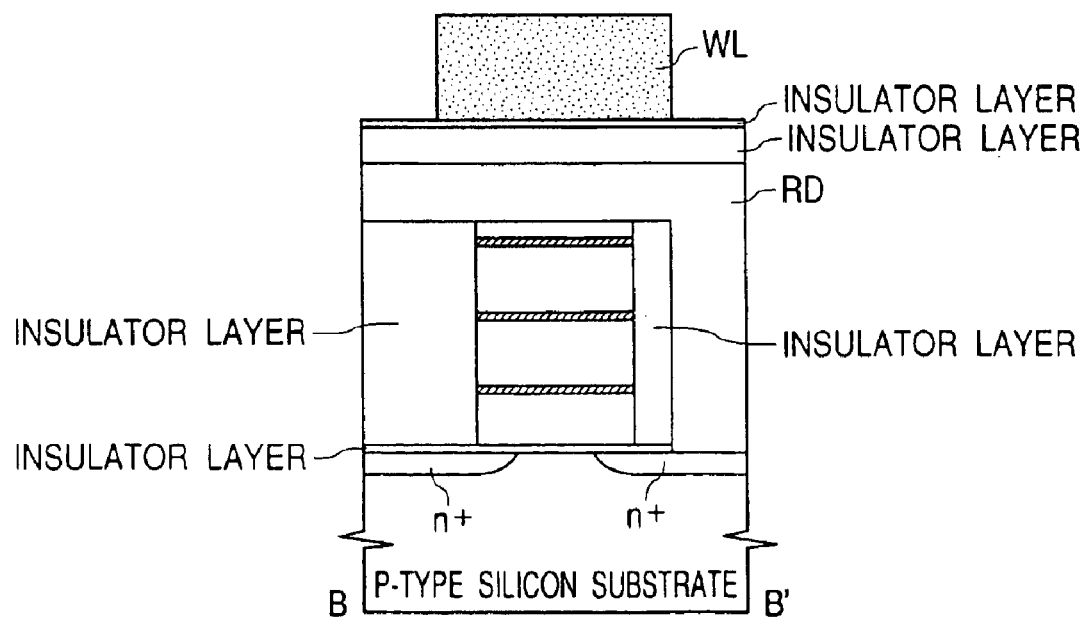
FIG. 7 is a cross sectional view of the memory cell of FIG. 5 taken along lines B–B'.

FIG. 5 is a concept plan view of the memory cell for the circuit of FIG. 2. The BMOS shown in FIG. 3 is utilized as the write transistor QW. The line A–A' of a cross section of FIG. 6 and the line B–B' of a cross section of FIG. 7 are respectively shown in FIG. 5. In these FIGS. 5 through 7, word line (WL11) formed of a boron-doped P-channel polysilicon layer is placed to intersect with the data line (RD1) formed of a phosphorus-doped N-channel polysilicon layer by way of a thick insulator film. The BMOS with a cubical barrier insulator film structure shown in FIG. 3 is laminated on top of the gate electrode (N11) of a conventional MOSFET. (QR of FIG. 1) so that an extremely high density memory cell can be obtained.

In contrast to the flat current flow in the storage MOSFET QR, the flow in the write transistor QW is clearly in a perpendicular direction relative to the QR flow. Therefore, in contrast to the fold-over data wiring layout of the DRAM memory cell of the known art having a theoretical surface area of 8F2 (F: smallest dimension), the device of this invention has a surface area of 4F2 so that a cell with half the surface area can be obtained. The coupling capacity (C) of FIG. 2, can be formed by a heat oxidized film between the word line WL and the polysilicon 4 as shown in FIG. 6. The size of C can be changed by adjusting the thickness of the layer of the polysilicon 4.

Compared to the DRAM cell of the known art comprised of one MOSFET and one capacitor, the memory cell of this embodiment can be manufactured with a smaller number of masks since the surface area of the memory cell is reduced by half and there are few irregularities on the surface. Therefore the memory chip of this invention is inexpensive and easier to be manufactured.

The data retaining (hold) time will also be sufficiently long if the memory cell of this embodiment is set to the write transistor QW threshold voltage (VTW) as previously described. Also, irradiation with alpha rays will make the device strongly resistant to even to soft-type errors. In other words, there is no pn junction in the memory cell node (N11) so that no junction leak current occurs as happens when using MOSFETs as write transistors such as for the memory cell of FIG. 1. Also, even if electrons or positive holes are emitted internally in the cell irradiated with alpha rays, the tunnel layer will function as a stopper for current flow from the positive holes or electrons so that no change in potential occurs inside the cell. The memory cell can therefore be operated as a nonvolatile memory.

Figure 8:
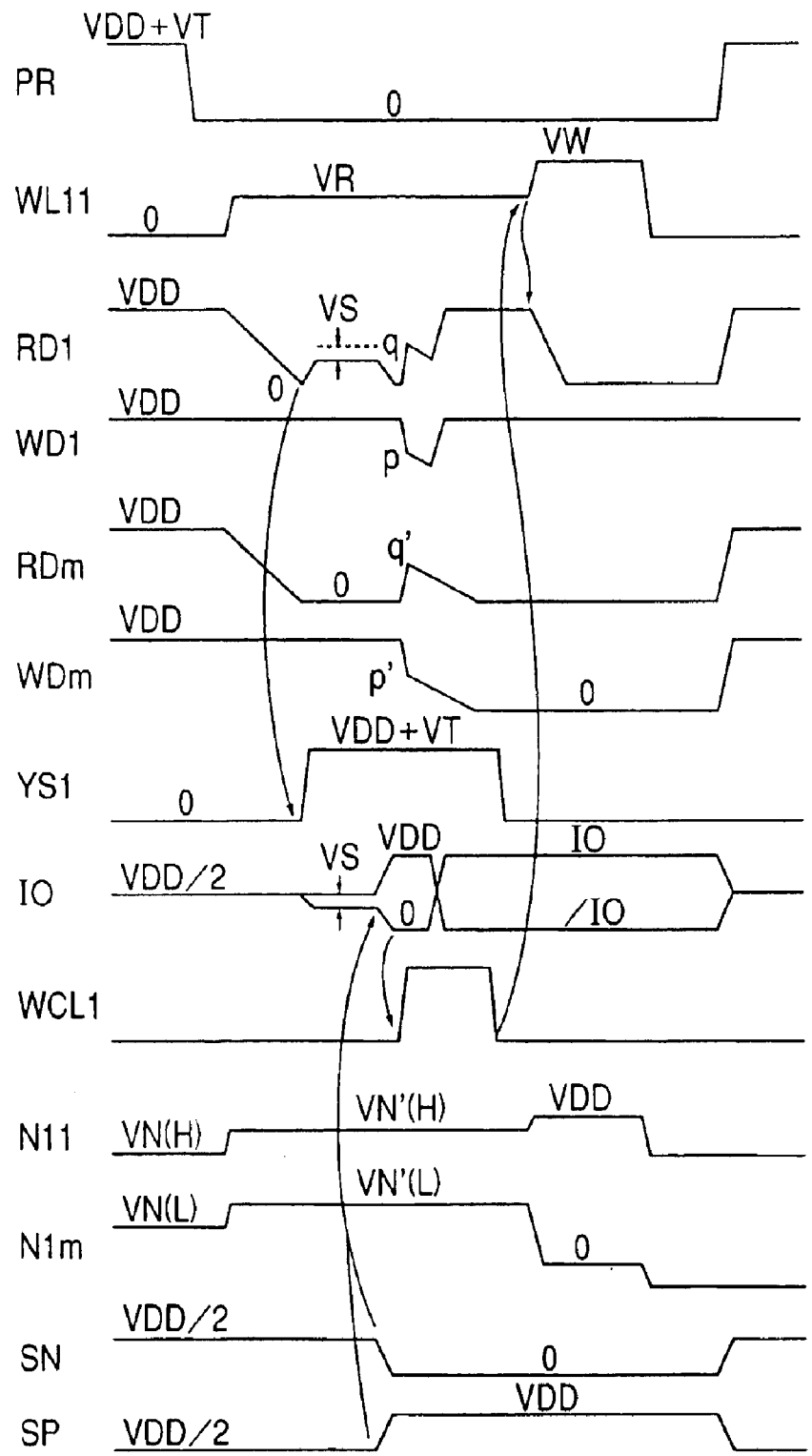
FIG. 8 is a waveform chart for describing one example of the memory circuit operation of FIG. 1 and FIG. 2.

FIG. 8 is a waveform chart for describing an example of the memory circuit operation of FIG. 1 and FIG. 2.

The precharge signal PR is set to a high level such as VDD+VT (Here, VT is the threshold voltage of the precharge MOSFET). Also, the read data lines RD1–RDm and the write data lines WD1–WDm are precharged to a high level such as the power supply voltage VDD. The common data line IO, and the common sources SP and SN for the sense amplifiers SA1–SAk are precharged in the same way to the half-precharge voltage VDD/2.

When the precharge signal PR changes to a low level, the precharge MOSFET sets to off, and each section such as the data lines are held at the precharge voltage.

Hereafter, an example of writing data from the common data line pair IO in the memory cell MC11 is described. To write a high level voltage VDD or a low level voltage of 0 volts corresponding to binary information of 1 or 0 in the memory node (gate) N11 of the memory cell MC11, after application of a voltage VW equal or greater than VDD+ VTW (VTW is the threshold voltage of the write transistor QW) to the word line WL11, a VDD or 0 volts can be supplied to the write data line WD1, by way of switch MOSFET QY11 from the common data line IO, and read data line RD1 and write control circuit WC1.

Here, it is important to note that when a selected voltage VDD+VTW is applied such as to the word line WL11, the memory information of the non-selected memory cells connected to the same word line WL11 is destroyed. In other words, the write transistor QW for the non-selected memory cells MC12–MC1m connected to the word line WL11, is set to on status, and a precharge voltage VDD of the write data line WDm is applied to the respective memory cell nodes N1m, etc.

In order to prevent this kind of destruction of information, the memory cell on select word line WL11 is first read out, and except for the selected memory cell MC11, the respective information that was read out is rewritten into the other non-select memory cells MC12–MC1m. Restated, data is input from the common data line IO instead of the read out data, in the rewrite operation, for the selected memory cell MC11 and the data used as the substitute can be used for writing.

Accordingly, in the memory circuit of this embodiment, the read operation must be performed prior to the write operation. In the embodiments in FIG. 1 and FIG. 2, the surface area of the memory cell is small so that the word line is jointly used for reading and writing and therefore the word line select level has two select levels consisting of read select level VR and a write select level VW.

In non-select status, the voltages for the respective memory nodes N11, N1m of the memory cells including the binary memory information 1 and 0 being read out are both lower than the MOSFET QR threshold voltage VTR. In FIG. 8, the higher voltage corresponds to 1 of the binary information and that voltage is VN (H), so that VN (H) is assumed to be less than VTR. Such voltage condition is realized by the capacitor C in the memory cells. In other words, when the word line WL11 has set to a non-select level such as zero (0) V, a lower voltage potential for the memory node VN(H) is obtained by means of the coupling per the capacitor C.

The storage MOSFET QR for the plurality of memory cells MC11–MCn1 connected to the one read data line RD1 is set to off status regardless of the memory voltage VN(H) and VN (L) corresponding to the binary information.

In the word line first select period, below the write transistor QW threshold voltage, there is given a low voltage VR in which the storage MOSFET QR holding the information voltage VN (H) in the gate is at on status and the storage MOSFET QR holding the information voltage VN (L) in the gate is at off status, and the word line WL11 is driven by the low voltage VR. In other words, when the word line WL11 is set to a read voltage such as voltage VR, the voltage potential of memory node N11 holding the information voltage VN (H) rises according to the select voltage VR by way of the capacitor C, becoming higher than the threshold voltage VTR and the storage MOSFET QR is set to on status, and the precharged read data line DR1 is made to discharge.

The voltage potential of memory node N11 holding the information voltage VN (L) does not reach the threshold voltage VTR even with a rise in voltage potential such as on the word line WL11 so that the storage MOSFET QR stays off and the read data line DR is maintained at the precharge voltage.

After performing memory information read out of the memory cell to the read data line such as DR, the Y select line YS1 is set to high level (VDD+VT), and the select MOSFET QY11 is set to on status. A connection is thus made to any or either of the read data line DR and the common data line IO or /IO and a minute read signal VS appears by the coupling with the respective accumulated parasitic capacitance charges.

If a read data line such as DR1 is discharged to a low level, then a small voltage drop occurs on the common data line IO due to coupling with the common data line IO discharged to VDD/2, and the read data line DR1 rises by a minute voltage due to the charge supplied from the common data line IO. Conversely, if the read data line DR1 remains precharged, then the common data line IO voltage rises by a minute amount according to the coupling with the common data line IO that was precharged to VDD/2, and the voltage on the read data line DR1 drops by a minute amount, according to the charge supplied to the common data IO line.

In this way, with a binary memory information value of 1 or 0 on the common data line IO (or /IO) of a memory cell, the precharge voltage on the other common data line is then set as the reference, and a minute read out signal such as –VS or +VS appears. This read signal ±VS is set to approximately 200 to 500 millivolts when the power supply voltage VDD is about 1 to 3 volts.

This kind of differential voltage VS on the common data lines IO and /IO is amplified by the sense amplifier SA1 set to operating status in response to a change in the sense amplifier enabling signal SN low level (0 volts) or SP high level (VDD), and then set to a VDD high level corresponding to the memory information and a low level in response to a ground potential of 0 volts in the circuit.

The control line WCL1 for performing line select, is set to a high level after verification of the voltage potential on the read data line DR1, the MOSFET QT1 comprising the write control circuit WC1 is set to on status and connected to the read data line DR1 and the write data line DW1. In other words, if the voltage potential on the read data line DR1 is a low level then a redistribution of the electrical charge occurs with the write data line DW1 and the voltage potential of the read data line DR1 drops to the potential of q in the drawing. However if both data lines RD1 and WD1 have an equal parasitic capacitance, then the redistribution of electrical charge occurs all at once and the potential on both data lines reaches VDD/2. Afterwards, both the data lines RD1 and WD1 are set to zero (0) level by means of a discharge path formed by the sense amplifier SA1 and the memory cell MC11. If the read data line DR1 is at a high level, then the write data line DW1 is maintained at the VDD corresponding to the precharge level.

In the discharge process for the data lines RD1 and WD1, when a high level write voltage (VDD) is added to common data line IO, both data lines RD1 and WD1 change to a high level (VDD) voltage potential in response to the write voltage. When a low level (0 volts) is added, both data lines RD1 and WD1 change to a high level (VDD) in response to the write voltage.

The Y select line YS1 and control line WCL1 are set to low level after these type of write voltages are conveyed to the write data line WD1, and the MOSFET QY11 and QT1 set to off status.

Then, in the second selection period, the word line W11 changes to a high voltage VW to set the write transistor QW to on status. Turning the write transistor QW on, conveys the voltages of the write data lines WD1 through WDm to the respective memory nodes N11 through N1m, writes the information voltages corresponding to external write signals in the selected memory cell MC11, and writes inverted voltages of the original memory voltages, in the other memory cells MC12 through MC1m.

When the write operations for the selected memory cells as described above and the so-called refresh (rewrite) operations for the non-selected memory cell have finished, the word line WL11 is set to a low level such as zero (0) volts. The voltage such as at the memory node N11 of the memory cell are at a sufficiently small voltage due to the capacitor C as previously described. Here, even when a high level such as VDD is written in the memory node N11, after the read data line RD1 has discharged to zero (0) volts, electrical current flow cannot continue in the storage MOSFET QR. Therefore, there is no need for providing a circuit to set the source terminal of the storage MOSFET QR to a floating state, and as shown in the figure, a steady connection to circuit ground potential can be achieved.

The timing for setting the MOSFET QT1 of the write control circuit WC1 to an off state, or in other words, the timing for setting the control line WCL1 to a low level non-select state is determined by the rewrite operation of the non-select cell rather than the write operation of the selected cell.

The reason why rewrite operation is determined by the non-select cell is that after the data lines RD1 and WD1 and RDm and WDm have reached the respective voltage potentials p, q or p', q' in the waveform of FIG. 8, the write data line WD1 of the select cell is driven by both the sense amplifier SA1 and the memory cell MC11, but the write data lines WD2–WDm of the non-select cells MC12–MC1m are driven only by the respective corresponding memory cells.

The read operation is as follows. After the read signals of the selected memory cells in the above write operation have been amplified and output by the sense amplifiers SA1–SAk, there is no input of external write signals or restated, the selected read data line RD1 and the write data line WD1 can be kept with their voltage potential unchanged and the select level of the word line set the high voltage VW for writing. The corresponding respective read voltages of selected cells and non-selected cells for read out connected to the selected word lines are rewritten at this time.

The refresh operation is as follows. This refresh operation is mainly applicable when using a MOSFET as the write transistor QW such as in the memory cell shown in FIG. 1. Here, when a BMOS having a barrier insulator structure as in the embodiment shown in FIG. 2 is used, the leakage charge from the memory node can be limited to a value small enough to be ignored and the memory information is non-volatile so the individual refresh operations are unnecessary however refresh operation may be required in some cases according to the BMOS design.

In the refresh operation, the Y select line YS in the waveform shown in FIG. 8 is not performed, and the word lines are set to voltage VR in the first select period in sequence from WL11 to WL1n as well as WLK1 to WLkn and the read out from the memory cell is performed, signals are conveyed to the write data line by way of the write control circuit, and then a high voltage VW can be set in the second select period and write can be performed in the memory nodes of the memory cell.

The memory cell has an internal gain function, and if a memory cell having separate read and write data lines, then the circuit method of this embodiment can be applied unchanged in such kind of memory cell.

Figure 9:
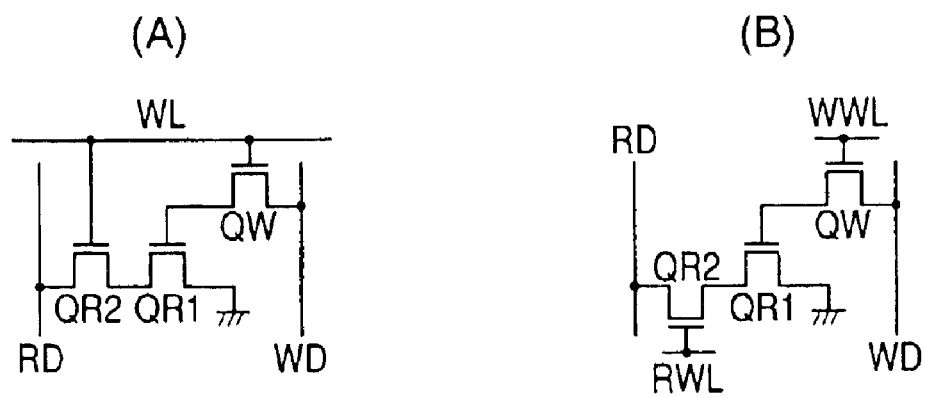
FIG. 9 is an essential portion of a circuit schematic showing another embodiment of the memory cell comprising the semiconductor integrated circuit of this invention.

FIG. 9 is a circuit schematic showing another embodiment of the memory cell utilized in the memory circuit of this invention. In (A) of FIG. 9 of this embodiment, a select MOSFET QR2 is formed between the read data line RD and the drain of the storage MOSFET QR1. The gate of this select MOSFET QR2 is connected to the word line WL. This structure may be considered in the memory cell of the embodiment of FIG. 1, as added with the select MOSFET QR2 and having the capacitor C removed.

In this case, the select operation of the word line is split between the read first select period and the write and rewrite second select period and the select voltages are changed. The select MOSFET QR2 and the write MOSFET QW threshold voltages are set according to these select voltages. In other words, the MOSFET QR2 is at on status at read voltage VR in the first select period, and the write MOSFET QW is at off status. In the second select period, at the write voltage VW, the write MOSFET QW is set to on status. The threshold voltage of the MOSFET QR2 is set low and the MOSFET QW threshold voltage is set high for the first select voltage VR corresponding to select/non-select operation for a word line of this kind with a three value level; and the MOSFET QW threshold voltage is set low for the second select voltage VW.

The MOSFET QR2 has been added in this embodiment so that the number of elements have increased however the capacitor C is not needed so that operation can be stabilized. In other words, the voltage margin can be increased when accessing the memory cell.

In FIG. 9, B is a changed version of the memory cell in A of the same figure. The word lines are separated into a write word line WWL and a read word line RWL. The gate of the write MOSFET QW is connected to the write word line WWL, and the gate of the select MOSFET QR2 is connected to the read word line RWL.

In this embodiment, a select/non-select operation utilizing a 3-value level for the word lines is unnecessary on account of separation of word lines into two lines, one for read and one for write. More specifically, the read word line RWL is set to select status in the word line first select period, and the select MOSFET QR2 set to on status by the select operation of read word line RWL causes current from the memory of the storage MOSFET QR1 (set to on or off status according to the memory cell information voltage) to flow in the read data line RD. If the storage MOSFET QR1 was set to on status by a high level information voltage, then the read data line RD is discharged, and if the storage MOSFET QR1 was set to off status by a low level information voltage then the read data line RD is maintained at the precharged voltage.

In the word line second select period with the write word line WWL set to select status, and the write MOSFET QW set to on status, the write voltage conveyed to the write data line WD is written into the gate of the storage MOSFET QR1. Though this embodiment increases the number of word lines by two lines, a benefit is that the write and the read word lines can respectively be set to select/non-select with binary information so that all threshold voltages of each MOSFET comprising a memory cell can be equivalent, thereby the design and manufacture is simplified.

In the write control circuit WC, when conveying the read signal appearing on the read data line RD unchanged to the write data line WD and performing rewrite (refresh), the memory node information voltage is inverted at that time. A data control register is then provided as described next, and the control of the data input/output buffer is implemented.

The concept for this control method utilizing as an example, a DRAM consisting of three transistors was previously related in the known art, in ISSCC72 (International Solid-State Circuits Conference in 1972) on pp. 12–13 of the digest. In other words, a data control cell having the same structure as a memory cell is connected to each word line. When a word line is selected, a read signal from the selected data control cell is output on the common output signal line.

The signal from the selected data control cell and the signal read out from the memory cell array via the sense amplifier are sent to an exclusive OR logic circuit and the output is sent as data output DO. However, the read signal to the data control register and the data input signal DI are summed in the same exclusive OR logic circuit and become write data in the memory cell array. In order to perform data input/output control at high speed, the channel width of the output transistor (equivalent to the read MOSFET QR) within the data control cell is made larger than the channel width of the memory cell.

Figure 10:
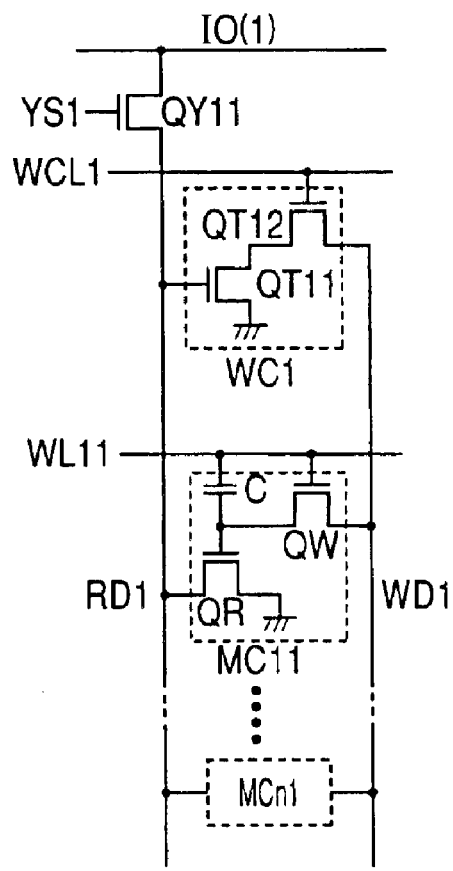
FIG. 10 is an essential portion of a circuit schematic showing an embodiment of the memory cell comprising the semiconductor integrated circuit of this invention.

FIG. 10 is an essential portion of a circuit schematic showing another embodiment of the memory cell comprising the semiconductor integrated circuit of this invention. In FIG. 10, one read data line RD1, write data line WD1 and common data line IO (1) corresponding to the read data line RD1, and one word line WL11 as well as one memory cell MC11 and write control circuit WC1 are used as typical elements to describe operation.

This embodiment comprises a memory cell MC11 the same as the embodiment of FIG. 1. In this embodiment, an inverting amplifier circuit comprised of a MOSFET QT11 and MOSFET QT12 are utilized at the write control circuit WC1 instead of the transfer gate MOSFET used previously. The MOSFET QT11 is an amplifying MOSFET whose gate is connected to the read data line RD 1. The MOSFET QT12 is an output select MOSFET for conveying the output from the drain of MOSFET QT11 to the write data line WD1. The gate of the MOSFET QT12 is connected to the control line WCL1 as the line select line.

In this structure, the memory information of the memory cell MC11 is read out to the read data line RD1, the output select MOSFET QT12 is set to on status by means of the high level on the control signal WCL1, and the inverted amplified signal obtained from the drain of the amplifier MOSFET QT11 is conveyed to the write data line WD1.

For example, if the memory node of the memory cell is stored with information at a high level, then as described before, the storage MOSFET QR is set to on status in the first select period of the word line WL11, and the read data line RD1 is discharged to a low level. Since the amplifier MOSFET QT11 sets to off status upon receiving the low level from the read data line RD1, even if the output select MOSFET QT12 is set to on status by selecting the control line WCL1, the write data line WD1 is kept unchanged at a precharge voltage potential such as VDD. Accordingly, when the write MOSFET QW is set to on status by the second select period of the word line WL11, then a high level voltage, the same as the memory voltage, is written into the memory node.

Conversely, when a low level (voltage) is stored in the memory node of the memory cell, the storage MOSFET QR sets to off status in the first select period of the word line WL11 as described before, and the read data line RD1 is maintained unchanged at a high level precharge state. Since the amplifier MOSFET QT11 sets to on status upon receiving this high level from the read data line RD1, when the output select MOSFET QT12 is set to on status by selecting the control line WCL1, the write data line WD1 is discharged to zero (0) volts. Accordingly, when the write MOSFET QW is set to on status by the second select period of the word line WL11, then a low level voltage, the same as the memory voltage, is written into the memory node.

When using an inverting amplifier function in the write control circuit WC1 in this way, the previously described data control register becomes unnecessary and design of the data input/output circuits becomes simple so that along with achieving high speed rewriting to a non-select cell, the memory cell is easier to use.

Figure 11:
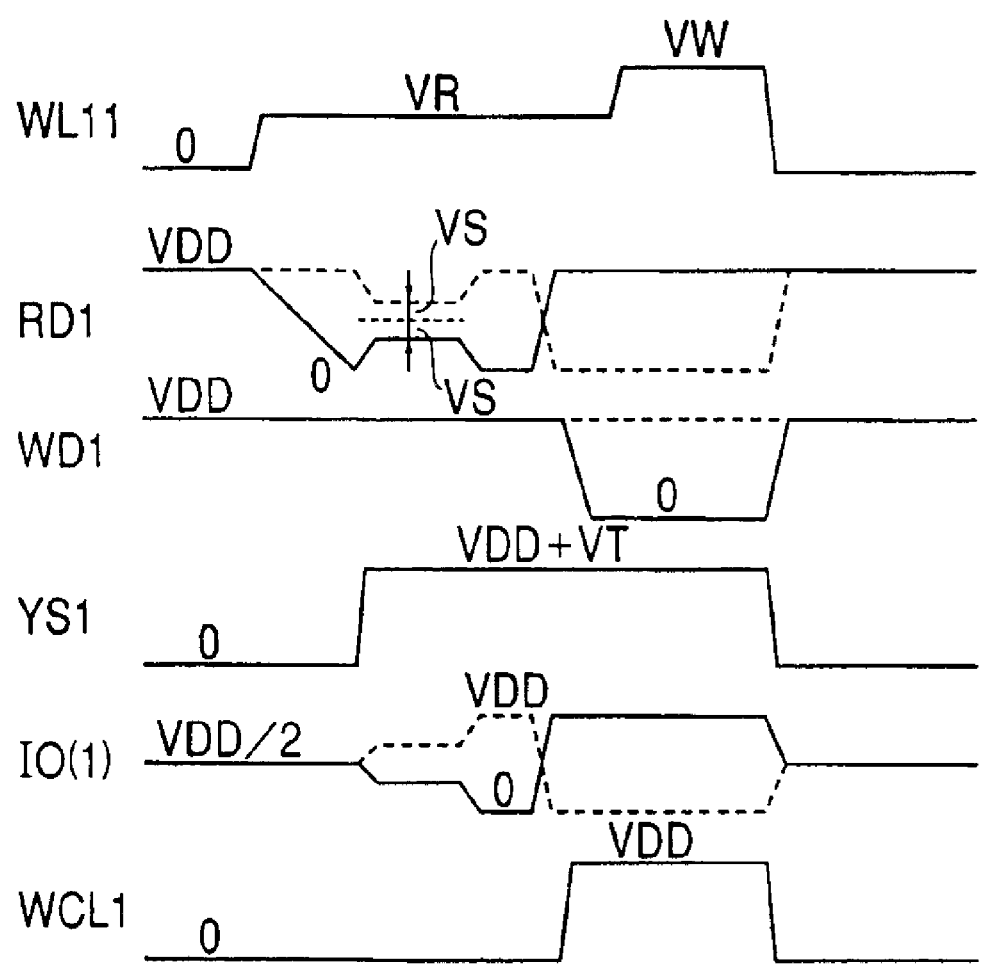
FIG. 11 is a waveform chart for describing one example of the memory circuit operation of FIG. 10.

FIG. 11 is a waveform chart for describing one working example of the memory circuit operation of FIG. 10.

The word line WL11 is set to a low read voltage VR in the first select period. In the non-select period, the read data line RD1 precharged to a VDD level is changed for the memory voltage of the memory node. In other words, in a state where an information voltage higher than the threshold voltage VTR of the MOSFET QR has been applied at the gate of the storage MOSFET QR, the MOSFET QR sets to on status and is discharged from VDD to zero (0) volts as shown by the solid line in the figure. In a state where an information voltage lower than the threshold voltage VTR of the MOSFET QR has been applied at the gate of the storage MOSFET QR, the MOSFET QR is set to off status and is maintained at the VDD precharge level as shown by the dotted line in the drawing.

When the Y select line YS1 is set to a high level such as VDD+VT, the read data line RD1 and the common data line IO (or /IO) are connected, and the redistribution of the electrical charge causes the read data line RD1 and the common data line IO to set to a high level or low level just by the minute voltage VS based on VDD/2. Afterwards, the amplifying operation of the sense amplifier starts and the read data line RD1 and the common data line IO change to a high level or a low level VDD. When the control line WCL1 is set to a high level, the write data line WD1 becomes a low level (zero volts) as shown by the solid line or a high level (VDD) as shown by the dotted line. The solid line and the dotted line in this figure correspond to changes in the voltage potential of read data line RD1 according to the memory cell information voltages.

After the voltage potential of the write data line WD1 has been set in this way, the voltage potential of the word line WL11 is changed to a write high voltage VW and by setting the MOSFET QW to on status, the memory node is rewritten to a high level or a low level according to the original information voltage. If the information voltage of the memory node had dropped due to a threshold leak current from the write MOSFET QW or from a leakage current between the source, drain diffusion layers and substrate of the MOSFET QW, then the above described rewrite operation will restore (refresh) the original information voltage.

The above described write control circuit WC, is applicable in the same way to the memory circuit shown in FIG. 2 or the memory circuit utilized in the memory cell shown in FIG. 9.

Figure 12:
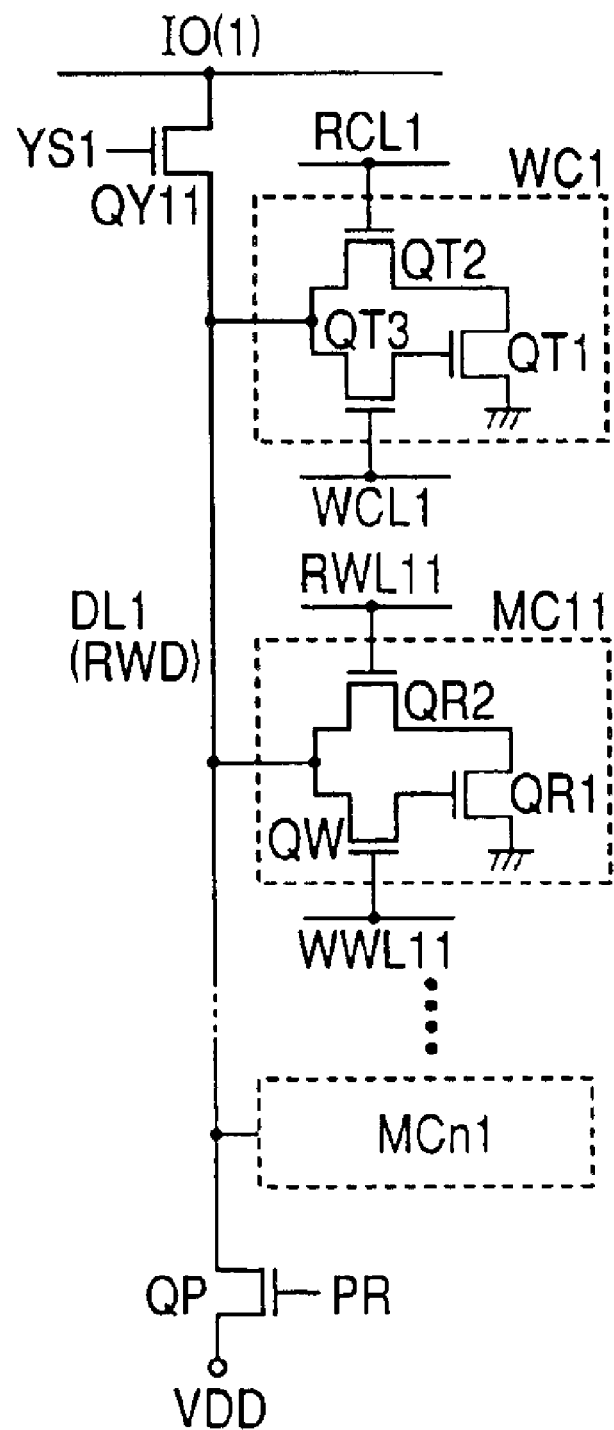
FIG. 12 is an essential portion of a circuit schematic showing an embodiment of the memory cell comprising the semiconductor integrated circuit of this invention.

FIG. 12 is an essential portion of a circuit schematic showing another embodiment of the memory cell comprising the semiconductor integrated circuit of this invention. In FIG. 12, one data line DL1, as well as one common data line IO (1) for the data line DL1, and one pair of read word lines RWL11, write word lines WWL11, one memory cell MC11 and write control circuit WC1 are used as typical elements to describe operation.

In this embodiment, the read data lines and write data lines are comprised of the common data line DL1. In other words, the data line DL1 is the read and write data line RWD. The memory cell MC11 utilizes the same circuit as shown in FIG. 9B. However, since the read data line and the write data line jointly comprise the data line DL1, one source and drain for the write MOSFET QW and the read select MOSFET QR2 are jointly connected to the data line DL1. The gate of the read select MOSFET QR2 is connected to the read word line RWL11, and the gate of the write MOSFET QW is connected to the write word line WWL11.

The data line DL1 is connected to the common data line IO by way of the column switching MOSFET QY11 comprising the data line select circuit. Though not shown in the drawing, the common data line IO is a common data line comprising one of the previously described pair of common data lines IO and /IO.

The write control circuit WC1 of this embodiment, is comprised of MOSFET QT1, QT2 and QT3 with the same circuit configuration as the memory cell MC11. The MOSFET QT1 corresponds to the storage MOSFET QR1, the MOSFET QT2 corresponds to the read select MOSFET QR2 of the memory cell, and the MOSFET QT3 corresponds to the write MOSFET QW. The gate of the MOSFET QT2 is connected to a first control line RCL1 for the read word line, and the gate of the MOSFET QT3 is connected to a second control line WCL1 for the write word line.

Figure 13:
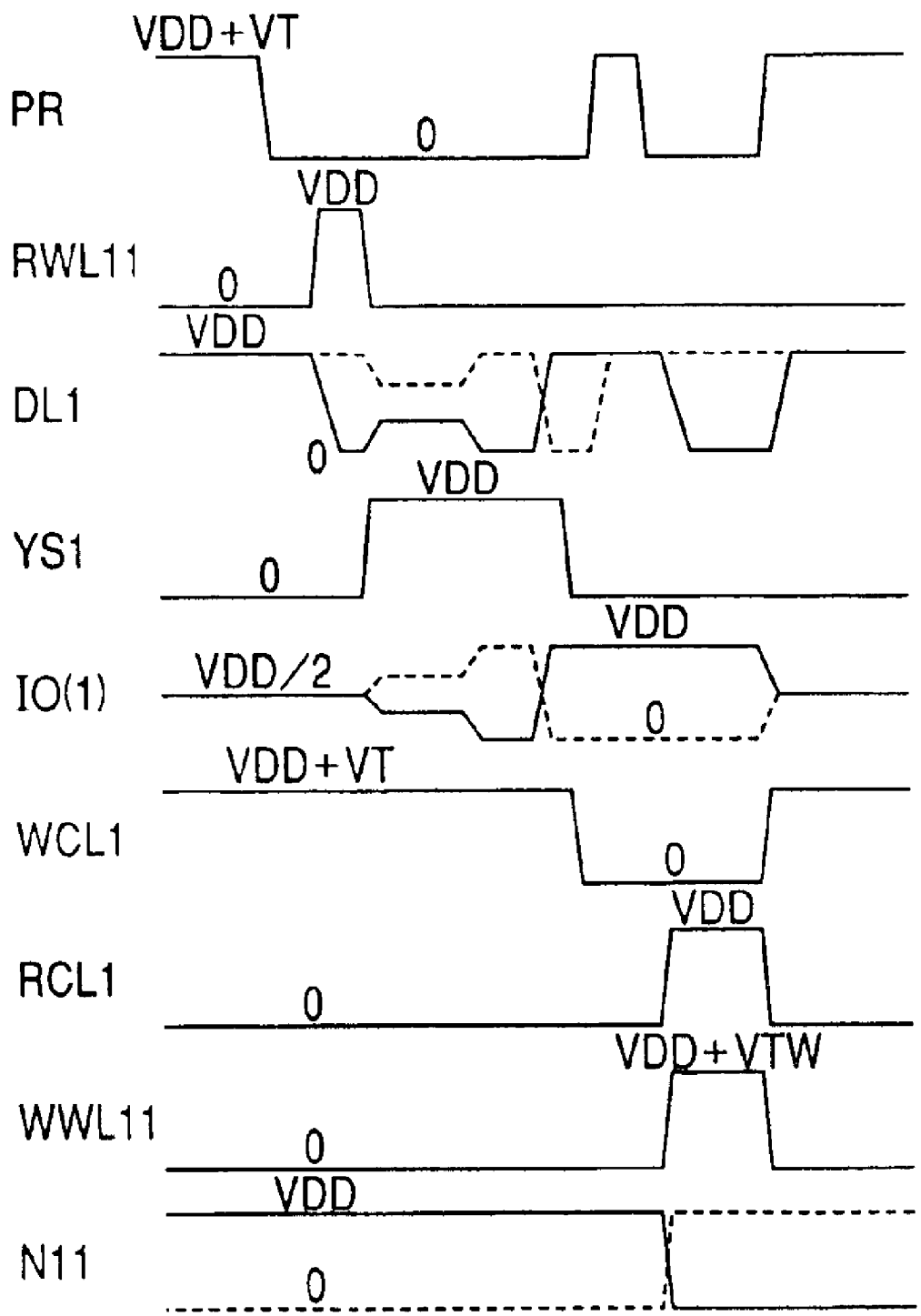
FIG. 13 is a waveform chart for describing one example of the memory circuit operation shown in FIG. 12.

FIG. 13 is a waveform chart for illustrating one example of the working example circuit operation shown in FIG. 12. The memory circuit operation shown in FIG. 12 is described while referring to this waveform chart.

With the memory circuit in non-select status, the precharge signal PR is set to a high level such as VDD+VT, the precharge MOSFET QP sets to on status and the data line DL is precharged to the power supply voltage VDD.

When accessing of the memory starts, the read word line RWL11 is set to a high level such as VDD after the precharge signal PR has been set to a low level. If a high level information voltage is held in the gate of the storage MOSFET QR1, then the MOSFET QR1 is set to on status so that the data line DL as shown by the solid line in the figure, is discharged towards a low level (zero volts). In contrast, if a low level information voltage is held in the gate of the storage MOSFET QR1, then the MOSFET QR1 sets to off status so that the data line DL1 remains unchanged at a high level (VDD) as shown by the dotted line in the figure.

The read data line and write data line are shared in this embodiment so that when the read operation described above is finished, the read word line RWL11 is set to low level non-select status. Afterwards, when the Y select signal YS1 becomes a high level (VDD) by means of the data line select circuit, the data line DL1 and the common data line IO are connected, and due to the dispersion of electrical charge, the common data line IO, is changed to a low level or a high level just by the minute voltage from the VDD/2 precharge voltage as previously described. In response to this change, the voltage potential of the data line DL1 changes to a potential opposite that of the common data line IO.

Though not shown in the drawing, the change in voltage potential on the common data line IO from the read operation, is amplified by a sense amplifier as previously described, using the precharge voltage VDD/2 of the other common data line /IO (not shown in the drawing) as a reference, and the voltage potential of the common data line IO and the selected data line DL1 is amplified to zero (0) volts or VDD.

The control line WCL1 of the write control circuit is set to a high level such as VDD+VT in an operating interval including non-select status. The change in voltage potential on the data line DL1 is conveyed to the MOSFET QT1, and by the change in the control line WCL1 to a low level, the read out and amplified voltage on the data line DL1 is held (latched) in the gate of the MOSFET QT1. The Y select signal YS1 is also changed to a low level along with this latching operation, and isolated from the data line DL and common data line IO (1).

During the write operation, when the Y select line YS1 is set to a high level, a write signal is conveyed to the common data line IO (1) by way of the sense amplifier and input circuit, and this write signal is held in the gate of the MOSFET QT1 of the write control circuit. In this way, in the writing operation, the write voltage from the common data line IO is latched in the write control circuit in the select memory cell, and the read signal is latched in the write control circuit in the non-select memory cell.

The precharge signal PR is temporarily set to a high level, and the data line DL1 is precharged to the VDD level. After this precharging is finished, the control line RCL1 and the write word line WWL11 are set to a high level. The select level for the write word line WWL11 is set as a high voltage such as VDD+VTW.

If a high level was latched at the gate of MOSFET QT1 of the write control circuit WC1, then the MOSFET QT1 is at on status so the data line DL1 is discharged to a low level by way of the MOSFET QT2, and this low level is written into the gate of the MOSFET QR1. However, if a low level was latched at the gate of MOSFET QT1 of the write control circuit WC1, then the MOSFET QT1 is at off status so the data line DL1 remains unchanged at a high level, and this level is written into the gate of the MOSFET QR1.

An operation of this type, allows the same write/read and refresh operations as in the circuit embodiments of FIG. 1 and FIG. 2 to be performed utilizing one data line. The number of data lines in this embodiment can be halved so that a simplified circuit can be achieved.

In the above kind of select cell read operation or non-select cell re-write operation, in the write control circuit, a re-inverted voltage is input to the memory node of the memory cell so that there is no inversion of a voltage to a high level/low level each time a memory node voltage is read out from the memory cell. Therefore, a data control register as previously related, becomes unnecessary and the memory cell is easier to use.

When a BMOS device having a barrier insulator structure as in the embodiment of FIG. 2, is used instead of a MOSFET as the write transistor of the memory cell and a vertical structure is used for the BMOS device, not only can the surface area of the memory cell be reduced but the memory (information) voltage can also be made nonvolatile. By also using a BMOS device for the MOSFET QT3 constituting the write control circuit, the surface area of the control circuit can also be reduced just the same as for the memory cell.

Figure 14:
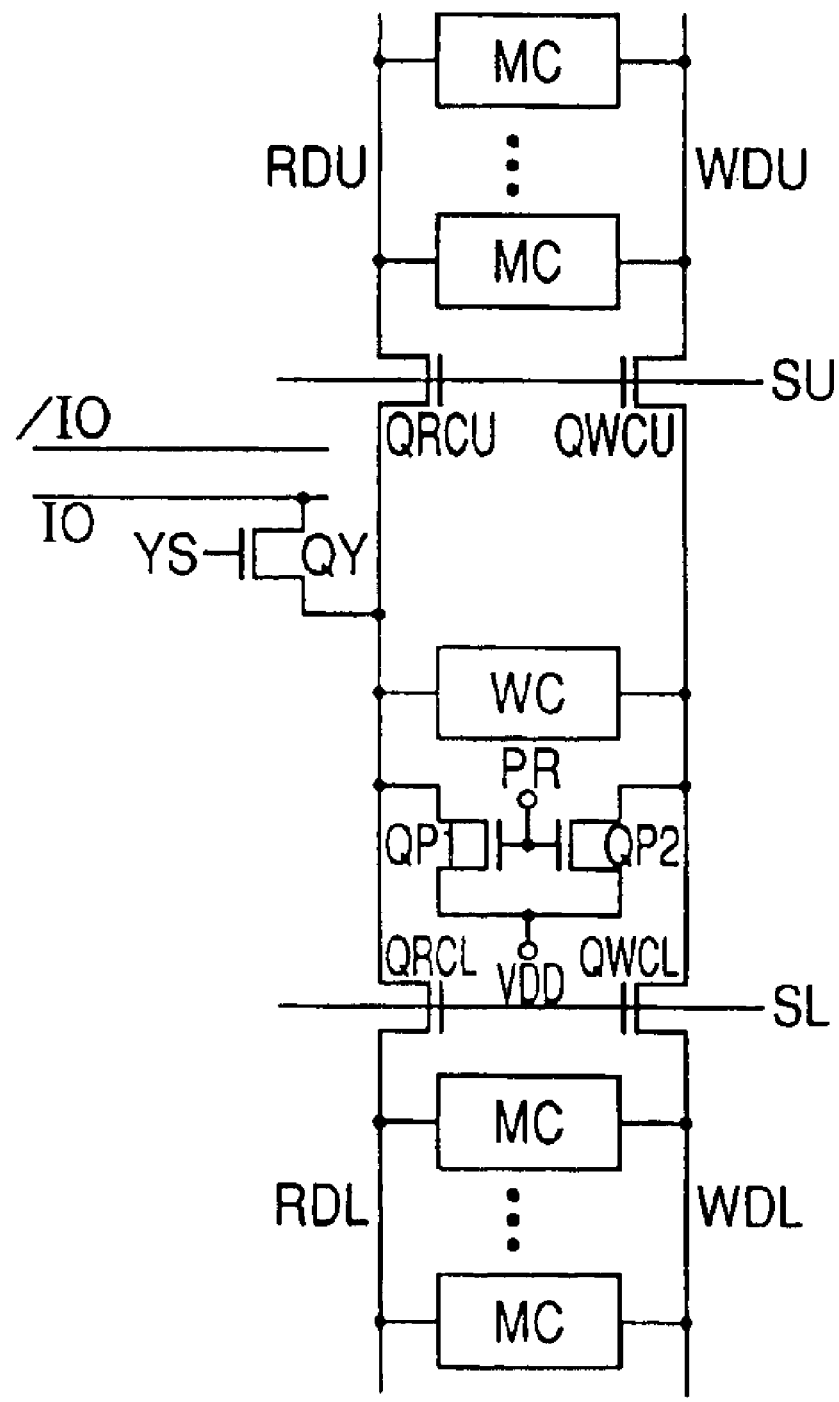
FIG. 14 is an essential portion of a circuit schematic showing an embodiment of the memory cell comprising the semiconductor integrated circuit of this invention.

FIG. 14 is an essential portion of a circuit schematic showing another embodiment of the memory cell comprising the semiconductor integrated circuit of this invention. When the memory capacity becomes large, the number of memory cells connected to read data lines and write data lines become numerous and as a result, parasitic capacitance increases and such increase delays operation.

In this embodiment, the read data lines and write data lines are separated vertically, (top and bottom) to reduce the parasitic capacitance in the data lines. In other words, line connection is performed selectively centering around the write control circuit WC and precharge circuit and data line select circuit by way of the selection switches QRCU, QWCU and, QRCL, QWCL.

In this structure, the data line select circuit and write control circuit WC can be jointly used with respect to the vertically separated data lines RDU, WDU and RDL, WDL. Any memory cell of the previously described embodiments shown in FIG. 1, FIG. 2 and FIG. 9 corresponding to the read data line and write data line may be used as the memory cell MC. A circuit as shown in FIG. 1 or a circuit with an inverting amplifier function as shown in FIG. 10 may be utilized as the write control circuit.

By setting the respective select signals SU and SL in FIG. 14 respectively to a high voltage such as VDD+VT, the vertically separated two pairs of data lines can be simultaneously precharged to VDD level by the precharge MOSFET QP1 and QP2.

After the precharging operation is complete, by setting the select signal SL corresponding to the data line for selection (for example RDL, WDL) unchanged at a high level, and setting the select signal SU corresponding to a non-select data line (RDU, WDU) to a low level, the MOSFET QRCU and QWCU can be set to an off state, and isolated from the write control circuit WC and data line select circuit. on the select side, with the write control circuit and data line select circuit connected to the data lines RSL and WDL, read, write or refresh operations can be performed as previously described. In this embodiment, separating the data lines reduces the data line length by half, and the parasitic capacitance and parasitic resistance is reduced so that high speed operation is possible.

The above embodiments incorporate a method for precharging the read data line to VDD in order to identify read signals from memory cells having internal gain.

Figure 15:
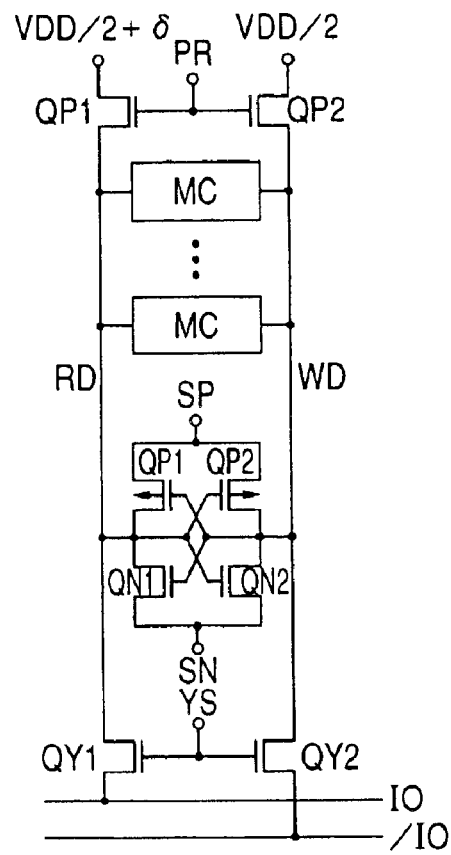
FIG. 15 is an essential portion of a circuit schematic showing yet another embodiment of the memory cell comprising the semiconductor integrated circuit of this invention.

FIG. 15 is an essential portion of a circuit schematic showing yet another embodiment of the memory cell comprising the semiconductor integrated circuit of this invention. When the memory cell comprises read data lines and write data lines and has a memory cell gain function, both of these read and write data lines are set to complementary levels when the write control circuit operates. In other words, when the signal read out from the read data line is a low level, the write data line is set to an opposite or high level. In this embodiment, this point is noted and a CMOS latch circuit is formed in the write control circuit and the embodiment is contrived for high speed signal changes in the data line.

Since greater semiconductor integration has resulted in utilization of memory cells comprising small elements and since many memory cells may be connected to one data line RD, the parasitic capacitance increases and a comparatively long time is required to discharge the read data line RD down to a full level of zero (0) volts.

This embodiment takes advantage of the fact that the write data line WD is set to a fixed voltage potential during read out and by using this fixed voltage potential as a reference voltage, at the point where a minute voltage differential occurs with the read data line RD, the voltage potential of the read data line RD can be set by amplification performed by sense amplifier comprised of CMOS latches with high drive power, and the voltage potential of the write data line WD for the non-select cell can also be set at the same time.

The sense amplifier utilizes a CMOS latch circuit comprised of a CMOS inverter circuit consisting of the N-channel MOSFET QN1, QN2 and P-channel MOSFET QP1, QP2 and their respective cross-connected inputs and outputs. This CMOS latch circuit is supplied with an enabling voltage SP such as the power supply voltage VDD during triggering of the sources of P-channel MOSFET QP1, QP2, and amplification is performed when an enabling voltage SN such as zero (0) volts is applied during triggering of the source of the N-channel MOSFET QN1, QN2.

In order to acquire the read signal, the write data line WD is precharged with an intermediate voltage of VDD/2 as the precharge voltage. The read data line RD on the other hand, is supplied with a high voltage VDD/2+δ added with just a minute voltage δ as the precharge voltage.

There are no particular restrictions on this structure and the read data line RD and write data line WD are connected to the pair of complementary common data lines IO and /IO by way of a data line select circuit comprised of a column switching MOSFET QY1 and QY2. The common data lines IO and /IO are precharged to VDD/2 the same as above.

When a sense amplifier is formed in the data lines RD and WD in this way, utilizing the common data lines IO and /IO as low amplitude signal lines, the read signal can be amplified by the main amplifier. Of course, a sense amplifier comprised of a CMOS latch circuit as related above can also be used.

In the write operation, a polarized differential voltage corresponding to the write information from the common data lines IO and /IO is supplied to the sense amplifier of the selected data lines RD and WD, and amplified to a high level/low level binary voltage by the applicable sense amplifier. In this structure, the sense amplifier functioning as the write control circuit performs inversion amplification so that the previously mentioned data control register is not necessary, and the structure is easy to use. The signal amplitude of the data lines RD and WD can be reduced by half to a high level/low level such as centering on VDD/2 so that low current consumption can also be achieved.

Figure 16:
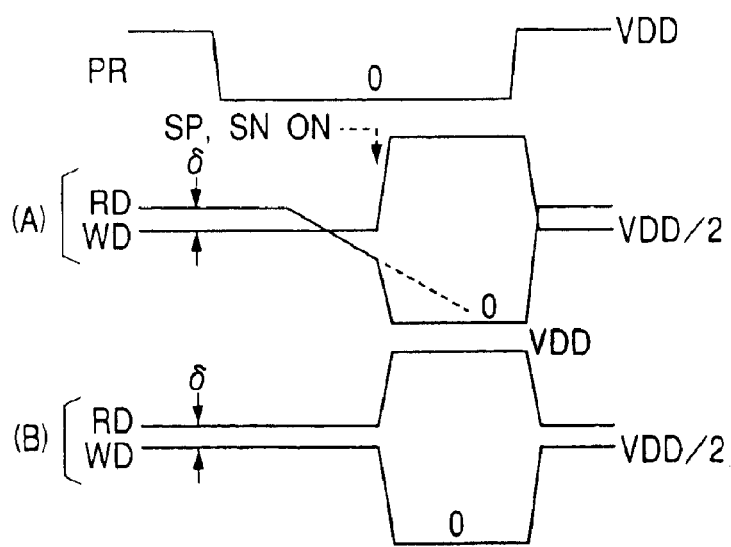
FIG. 16 is a waveform chart for describing one example of the memory circuit operation shown in FIG. 15.

As shown in the waveform chart of FIG. 16, in order to achieve the above described read operation, the precharge voltage VDD/2 for the write data line WD must be set to a voltage higher by an amount δ in order to obtain a precharge voltage of VDD/2+δ on the read data line RD. The reason for setting a voltage differential is that, when both RD and WD are precharged to the same voltage potential of VDD/2, and a low level is held in the memory node of the memory cell, when no discharge path is formed such as during read out, the voltage potential of the read data line RD stays precharged to VDD/2, and is equal to the voltage potential on the write data line WD functioning as the reference voltage so that the sense amplifier is disabled.

By providing a voltage differential by a minute voltage δ in the precharge voltage as shown above, a discharge path is formed by the memory cell read operation as shown in waveform (A), so that the voltage potential on the data line RD changes to low level. When the relative voltage potential has reversed, amplifying operation is performed by setting the timing signals SP and SN of the source to on for enabling the sense amplifier, to make the data lines RD and WD change to high level/low level at high speed.

As shown in waveform (B), when a discharge path is not formed by the memory cell read operation, the data line RD is maintained at a high level just by the voltage potential δ and by setting the timing signals SP and SN to on to enable the sense amplifier, and by performing amplifying operation, the data lines RD and WD are made to change between high level/low level at high speed.

The effects of this invention as obtained from the above embodiments are as follows.

First, by utilizing a memory cell containing a write transistor and a storage MOSFET to retain information voltage in the gate, a word line placed to intersect with a write data line conveying write data and a read data line conveying a read signal corresponding to the on or off status of the memory cell storage MOSFET, and a memory cell array for connecting to the control terminal of the write transistor of the memory cell and for issuing an output on the read data line corresponding to the read signal from the memory cell in response to a select signal from the write transistor, and by means of a data line select circuit to select one read data line from among the plurality of read data lines and connect to either a first or second common data line, and precharge the read data line to a first voltage within a non-select period, and in a first select period, by selecting a word line for reading and discharging the word line to a second voltage by means of a storage MOSFET of the memory cell set to on status, by precharging the first and second common data lines to a third voltage between the first and second voltages in the non-select period, and in the first select period, the read signal appearing on one common data line corresponding to the charge dispersion with the read data line selected by the data line select circuit is amplified using the precharge voltage of the other common data line as the reference voltage, and after conveying the write signals to the write data line in the second select period if needed, by setting the word line to a high voltage, setting the write transistor to on status and by writing or rewriting in the memory cell, there can be achieving the effect that the memory cell itself has an amplifying function, and read out of information is nonvolatile so that a memory circuit can be attained having a simplified circuit design that is easy to use.

Second, by having approximately the same number of read data lines connected by way of the data line select circuit to the first and second common data lines, and read signals are formed in one of the common data lines by electrical charge dispersion, and a sense amplifier is formed comprising a differential amplifier circuit utilizing the precharge voltage of the other common data line as the reference voltage so that in addition to the above effects of the invention, stable and high speed read operation can be achieved.

Third, by utilizing a complementary metal-oxide semiconductor latch circuit consisting of a pair of CMOS inverter circuits having cross-connected inputs and outputs as the differential amplifier circuit, along with obtaining high speed read out as related above, an effect is rendered that the write operation onto the selected memory cell can be performed at high speed.

Fourth, by providing a write control circuit to convey signals from the read data line, between the read and write data lines, to the write data line, in addition to the above effects of the invention, an effect is rendered that rewriting can be easily performed when the memory voltage has dropped due to a leakage current or other factors.

Fifth, by utilizing a read data line, a write data line and a transfer gate MOSFET connecting these read and write data lines as the write control circuit, in addition to the above effects of the invention, an effect is rendered that the circuit is simplified.

Sixth, by utilizing an inverting amplifier circuit to invert and amplify the signal voltages of the read data lines, and convey the signal voltages to the write data lines as the write control circuit, in addition to the above effects of the invention, an effect is rendered that the data control register can be omitted and the circuit becomes easier to use.

Seventh, by forming a structure with a barrier insulator film configured in a cubic shape having an electrical current path in a vertical direction towards the surface of the gate electrode on a MOSFET, as the write transistor comprising the memory cell, and by forming a capacitor between the word line and the gate of that MOSFET, in addition to the above effects of the invention, an effect is rendered that a large decrease in the cell surface area and nonvolatile memory voltage can be obtained or an increase in data holding time can be achieved.

Eighth, by utilizing a MOSFET as the write transistors comprising the memory cell, and by forming a capacitor between the word line and the gate of that MOSFET holding the information (memory) voltage, in addition to the above effects of the invention, an effect is rendered that the memory circuit can be formed without the addition of any special manufacturing process.

Ninth, by separating the word line into write word lines and read word lines, setting the read word line to select status in a first select period, and setting the write word line to select status in a second select period, by connecting that write word line to the gate of a MOSFET functioning as the write transistor of the memory cell, and by connecting the gate of the select MOSFET in serial to the read word line for the storage MOSFET gate holding the memory voltage, the select level of the word line can be set to a binary (two value) level so that in addition to the above effects of the invention, an effect is rendered that the word line select operation is simplified and the operating margin is expanded.

Tenth, by making the write word line and the read word line a common word line, and setting the write MOSFET threshold value higher than the select MOSFET threshold value, and by setting only the select MOSFET to on status in the first select period, and by also setting the write MOSFET to on status in the second select period, so that the above related memory operations are achieved and an effect is rendered that the memory circuit can be formed without the addition of any special manufacturing process.

Eleventh, by making the read data line and the write data line into one common data line, forming a dummy cell with the same circuit as the memory cell to function as the write control circuit, the read signal or the write signal from the data line is written into the write control circuit, and is conveyed as a write signal to the common data line for that read out signal, and by writing this write signal into the memory cell selected by the word line, in addition to the above effects of the invention, an effect is rendered that the circuit is simplified and the memory operation does not require a data control register.

Twelfth, by utilizing a MOSFET as the write transistor comprising the memory cell, and connecting the write word line to the gate of that MOSFET, and forming a select MOSFET between the data line and storage MOSFET whose gate holds the memory voltage of the memory cell, connecting the read word line to the gate of that MOSFET, and connecting the read control line corresponding to the read word line utilizing the write control circuit consisting of the dummy cell to the write control line corresponding to the write word line, the write control circuit can then be controlled by enabling the write control line and read control line, so that in addition to the above effects, an effect is obtained that the circuit is simplified and the memory operation does not require a data control register.

Thirteenth, by selectively connecting the write data line and read data line by means of a switching circuit mainly for the write control circuit, precharge circuit and data select circuit, in addition to the above effects, parasitic capacitance in the data line and parasitic resistance can be reduced so that high speed and stable operation can be achieved.

Fourteenth, by utilizing a memory cell containing a write transistor and a storage MOSFET to retain information voltage in the gate, a word line placed to intersect with a write data line conveying write signal and a read data line conveying a read signal corresponding to the on or off status of the memory cell storage MOSFET, and a memory cell array for connecting to the control terminal of the write transistor of the memory cell and for issuing an output on the read data line corresponding to the read signal from the memory cell in response to a select signal from the write transistor, by forming a sense amplifier comprised of a CMOS latch circuit formed between the read data line and the write data line, precharging the read data line to a first voltage potential in a first period, precharging the write data line to a second voltage smaller than the first voltage in the first period, selecting the word line in the second period and discharging the read data line to a third voltage potential by the on status of a storage MOSFET of the memory cell, and after the read data line has been set to a first voltage or a third voltage according to the memory information voltage of the memory cell, the sense amplifier is set to operating status and amplification to a high level or low level is performed according to the operation voltage of the sense amplifier, and by means of a data line select circuit, by selecting one pair from among the plurality of write data lines corresponding to read data lines and connecting to a first and second common data line, high speed and stable operation can be achieved.

Fifteenth, by setting the power supply voltage and the circuit ground voltage potential as the high and low level corresponding to the sense amplifier operation voltages, setting the second voltage to one-half of the power supply voltage, and setting the first voltage to a minimum voltage higher than the second voltage required for stable amplifying operation, an effect is rendered that the amplitude on the data line becomes smaller and a circuit with high speed operation and low power consumption can be achieved.

A basic explanation was related above based on the embodiments of the invention rendered by the inventors, however needless to say, the scope of this invention is not limited by the above description and encompasses a variety of changes within the spirit and range of the invention. In FIG. 1 and FIG. 2 for example, a positive voltage was used for VDD, however a P-channel MOSFET may be substituted for the N-channel MOSFET as a precharge MOSFET. By using a P-channel MOSFET, the control signal PR having a low level such as the circuit ground potential will reach an active level so that a high voltage larger than VDD is not required. Therefore, even when the memory circuit was in non-select status for a long time, when utilizing an N-channel MOSFET, there is no need for special measures such as continual operation of a charge pump circuit to maintain the precharge signal at a boosted voltage.

In the memory cells of FIG. 9 and FIG. 12, the write transistor QW may be substituted with a MOSFET with a barrier insulator structure (or BMOS) and formed as a vertical structure on the gate of the storage MOSFET QR1. In other words, this MOSFET with a barrier insulator structure, can be utilized as a write transistor in all the memory cells shown in these embodiments as well as in dummy cells used as a write control circuit or all of the memory cells as the data control resistor. Nonvolatile memory voltage can in principle be achieved by utilizing this MOSFET with barrier insulator structure. A large decrease in the surface area of the circuit cell can also be achieved.

The differential amplifier circuit formed in the common data line IO and /IO may use an operational amplifier circuit as the differential amplifier circuit other than the CMOS latch circuit as mentioned in the embodiments.

The memory array structure may also utilize a hierarchical structure of the known art, placing a plurality of memory arrays in the direction of the word line, and grouping the word lines into main word lines and sub-word lines such as in a dynamic RAM. The memory circuit, along with using digital circuits for digital processing such as with a microprocessor CPU, may be internally stored inside one semiconductor integrated circuit device, itself comprising a general purpose memory circuit. An input circuit is formed in the general purpose memory circuit to input address signals and control signals. In a memory circuit internally incorporated in a digital circuit, the applicable input circuits are omitted, and address signals and control signals are supplied by way of an internal bus to the decoder.

INDUSTRIAL APPLICABILITY

This invention is widely applicable to semiconductor integrated circuit devices consisting of a memory cell comprising a storage MOSFET combining memory operation and amplifying operation, and a write transistor to write information voltages in the gate of the storage MOSFET, or to semiconductor integrated circuit devices incorporating memory circuits and other logic circuits.

What is claimed is:

1. A semiconductor integrated circuit device comprising:
   a plurality of memory cells, each having a storage MOSFET holding an information in a gate of the storage MOSFET, a write transistor supplying a write information voltage corresponding to the information to the gate of the storage MOSFET, and a capacitor having a first terminal and a second terminal;
   a plurality of word lines coupled with the plurality of the memory cells; and
   a plurality of data lines coupled with the plurality of the memory cells,
   wherein the first terminal of the capacitor is coupled with one of the plurality of word lines and the second terminal of the capacitor is coupled with the gate of the storage MOSFET,
   wherein, in a read operation of the semiconductor integrated circuit device, the gate voltage of the storage MOSFET is boosted by a transition of the word line from a first voltage to a second voltage greater than the first voltage and
   wherein the first terminal of the capacitor and a gate of the write transistor are commonly coupled to the same one of the plurality of word lines.

2. A semiconductor integrated circuit device according to claim 1, wherein the plurality of data lines have a plurality of write data lines and a plurality of read data lines,
   wherein each of the plurality of the write data lines is coupled with the write transistor included in each of the plurality of memory cells, and
   wherein each of the plurality of the read data lines is coupled with the storage MOSFET in each of the plurality of memory cells.

3. A semiconductor integrated circuit device according to claim 2, further comprising:
   a plurality of write control circuits connected between the plurality of read data lines and the plurality of write data lines, respectively,
   wherein each of the plurality of write control circuits conveys a signal which appeared on a corresponding one of the plurality of read data lines to a corresponding one of the plurality of write data lines.

4. A semiconductor integrated circuit device according to claim 1, further comprising:
   a data line select circuit selecting one of the plurality of data lines; and
   a first and a second common data line coupled with one of the plurality of the data lines selected by the data line select circuit, wherein the first and second common data lines are precharged to a precharge voltage that is between a high level voltage and a low level voltage at a time of amplifying voltages on the first and the second common data lines, and
   wherein a read information which appears on one of the first and second common data lines is amplified using the precharge voltage of the other of the first and second common data lines as a reference voltage.

5. A semiconductor integrated circuit device according to claim 4,
   wherein the same number of data lines are respectively coupled with each of the first and second common data lines via the data line select circuit, and
   wherein the semiconductor integrated circuit device includes a differential amplifier circuit that amplifies the read information produced on one of the first and second common data lines by a charge share with the read data line selected by the data line select circuit using the precharge voltage of the other of the first and second common data lines as the reference voltage.

6. A semiconductor integrated circuit device according to claim 1, wherein the storage MOSFET is set to an OFF state regardless of the write information voltage in a write operation of the semiconductor integrated circuit, wherein, in the read operation of the semiconductor integrated circuit device, the storage MOSFET is set to an ON or OFF state corresponding to the information held in the gate of the storage MOSFET by the transition of the word line from the first voltage to the second voltage.

7. A semiconductor integrated circuit device according to claim 1, wherein the write transistor is formed above the storage MOSFET.

8. A semiconductor integrated circuit device comprising:
a plurality of memory cells, each having a storage MOSFET holding an information in a gate of the storage MOSFET and a write transistor supplying a write information voltage corresponding to the information to the gate of the storage MOSFET; and
a plurality of word lines coupled with the plurality of memory cells,
wherein the write information voltage is selected from a first voltage and a second voltage greater than the first voltage corresponding to the information to be stored in the memory cell and is supplied to the gate of the storage MOSFET,
wherein, in a write operation of the semiconductor integrated circuit device, the storage MOSFET is set to an OFF state regardless of the write information voltage,
wherein, in a read operation of the semiconductor integrated device, the write information voltage is boosted by a transition of a voltage of the word lines,
wherein, when the write information voltage is the first voltage, the storage MOSFET is set to the OFF state in the read operation, and
wherein, when the write information voltage is the second voltage, the storage MOSFET is set to an ON state in the read operation.

9. A semiconductor integrated circuit device according to claim 8, wherein the write transistor is formed above the storage MOSFET.

10. A semiconductor integrated circuit device according to claim 8, wherein each of the plurality of the memory cells further has a capacitor coupled between the gate of the storage MOSFET and a corresponding one of the plurality of word lines.

11. A semiconductor integrated circuit device according to claim 8, wherein the gate of the write transistor is coupled with a corresponding to one of the plurality of word lines.

12. A semiconductor integrated circuit device according to claim 8, further comprising:
a plurality of data lines coupled with corresponding ones of the plurality of the memory cells,
a data line select circuit selecting one of the plurality of the data lines; and
a first and a second data line being coupled with one of the plurality of the data lines selected by the data line select circuit,
wherein the first and second common data lines are precharged to a precharge voltage that is between a high level voltage and a low level voltage at a time of amplifying voltages on the first and the second common data lines, and
wherein the read information which appears on one of the first and second common data lines is amplified using the precharge voltage of the other of the first and second common data lines as a reference voltage.

13. A semiconductor integrated circuit device according to claim 12, wherein the plurality of data lines has a plurality of a write data lines and a plurality of a read data lines,
wherein each of the plurality of write data lines is coupled with the write transistor included in each of the plurality of memory cells, and
wherein each of the plurality of read data lines is coupled with the storage MOSFET in each of the plurality of memory cells.

14. A semiconductor integrated circuit device according to claim 13, further comprising:
a plurality of write control circuits connected between the plurality of read data lines and the plurality of write data lines, respectively,
wherein each of the plurality of write control circuits conveys a signal which appeared on a corresponding one of the plurality of read data lines to a corresponding one of the plurality of write data lines.

15. A semiconductor integrated circuit device comprising:
a memory array, wherein the memory array further includes; a plurality of memory cells, each having a storage MOSFET holding an information voltage in a gate of the storage MOSFET and set to an ON or OFF state according to the information voltage, and a write transistor supplying a write information voltage corresponding to the information voltage to the gate of the storage MOSFET;
a plurality of write data lines, each being applied with the write information voltages given as the information voltage of corresponding ones of the memory cells;
a plurality of read data lines, each being applied with a read information corresponding to the ON or OFF state of the storage MOSFET of the memory cells;
a word line structure connected to the plurality of memory cells;
a data line select circuit selecting one of the plurality of read data lines; and
first and second common data lines being connected to one of the read data lines selected by the data line select circuit,
wherein, during a non-select state, the write transistor is set to an OFF state and the storage MOSFET is set to on OFF state,
wherein, in a first select period, the write transistor is set to an OFF state, the read data line is discharged when the information voltage is high level or the read data line is not discharged when the information voltage is low level,
wherein, in a second select period, in which either the information voltage to be written into the write data lines or a read information voltage corresponding to the read information are applied, the write transistor is set to ON state,
wherein the first and second common data lines are precharged to a precharge voltage that is a voltage between a high level voltage and a low level voltage at a time of amplifying voltages on the first and the second common data lines in the non-select state, and wherein the read information which appears on one of the first and second common data lines corresponding to a voltage which appeared on the read data line selected by the data line select circuit is amplified using the precharge voltage of the other of the first and second common data lines as a reference voltage.

16. A semiconductor integrated circuit device according to claim 15,
wherein the same number of data lines are respectively coupled with each of the first and second common data lines via the data line select circuit, and
wherein the semiconductor integrated circuit device includes a differential amplifier circuit that amplifies the read information produced on one of the first and second common data lines by a charge share with the read data line selected by the data line select circuit using the precharge voltage of the other of the first and second common data lines as the reference voltage.

17. A semiconductor integrated circuit device according to claim 16,
wherein the differential amplifier circuit includes a CMOS latch circuit having a pair of CMOS inverter circuits, the pair of CMOS inverter circuits having cross-coupled inputs and outputs, and an operating voltage of the CMOS latch circuit is supplied during amplification.

18. A semiconductor integrated circuit device according to claim 17, further comprising:
a write control circuit connected between the read data lines and the write data lines,
wherein the write control circuit applies the read information on the read data lines to the write data lines.

19. A semiconductor integrated circuit device according to claim 18,
wherein the write control circuit is comprised of a transfer gate MOSFET connecting the read lines with the write data lines.

* * * * *